(12) United States Patent
Yoshida et al.

(10) Patent No.: US 7,348,186 B2
(45) Date of Patent: Mar. 25, 2008

(54) METHOD FOR IMPROVING A SEMICONDUCTOR SUBSTRATE HAVING SIGE FILM AND SEMICONDUCTOR DEVICE MANUFACTURED BY USING THIS METHOD

(75) Inventors: Akira Yoshida, Kawasaki (JP); Tomoya Baba, Ikoma (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/639,647

(22) Filed: Aug. 13, 2003

(65) Prior Publication Data

US 2004/0058482 A1    Mar. 25, 2004

(30) Foreign Application Priority Data

Aug. 21, 2002  (JP)  ............................. 2002-241010

(51) Int. Cl.
*H01L 21/66* (2006.01)
(52) U.S. Cl. .................. 438/14; 438/478; 438/758; 438/766; 257/E21.525
(58) Field of Classification Search ................ 438/14, 438/478, 758, 766, 933
See application file for complete search history.

(56) References Cited

U.S. PATENT DOCUMENTS

| | | | |
|---|---|---|---|
| 5,706,164 A * | 1/1998 | Jeng ........................ 361/321.4 |
| 6,562,703 B1 * | 5/2003 | Maa et al. ................... 438/518 |
| 6,583,000 B1 * | 6/2003 | Hsu et al. ................... 438/222 |
| 6,593,625 B2 * | 7/2003 | Christiansen et al. ....... 257/347 |
| 6,709,903 B2 * | 3/2004 | Christiansen et al. ....... 438/149 |
| 2004/0012075 A1 * | 1/2004 | Bedell et al. ............... 257/616 |

OTHER PUBLICATIONS

Mii et al., "Extremely High Electron Mobility in Si/$Ge_xSi_{1-x}$ Structures Grown by Molecular Beam Epitaxy," Applied Physics Letters, vol. 59, No. 13, Sep. 23, 1991, pp. 1611-1613.
Trinkaus et al., "Strain Relaxation Mechanism for Hydrogen-Implanted $Si_{1-x}Ge_x$/Si(100) Heterostructures," Applied Physics Letters, vol. 76, No. 24, Jun. 12, 2000, pp. 3552-3554.
EP Search Report dated Apr. 27, 2006 for application EP 03 01 8848.
"High speed transport in Si/$Si_{1-x-y}Ge_xC_y$ heterostructures", Muhlberger et al., Thin Solid Films 369 (2000) 306-311.
"Strain relaxation of pseudomorphic $Si_{1-x}Ge_x$/Si(100) heterostructures after hydrogen or helium ion implantation for virtual substrate fabrication", Hollander et al., Nuclear Instruments and Methods in Physics Research B 175-177 (2001) 357-367.

(Continued)

*Primary Examiner*—M. Wilczewski
*Assistant Examiner*—Christy L Novacek
(74) *Attorney, Agent, or Firm*—Nixon & Vanderhye P.C.

(57) ABSTRACT

A method of improving a semiconductor substrate including a SiGe film on a Si or SOI substrate is provided. The method includes determining a relationship between a film condition of the SiGe film and a hydrogen ion implantation condition used in making the SiGe film so as to achieve relaxation of lattice distortion in the SiGe film as well as improved crystallinity and/or surface condition of the SiGe film, so that improved conditions for improving quality of the SiGe film on the Si or SOI substrate can be determined.

18 Claims, 15 Drawing Sheets

OTHER PUBLICATIONS

"Strain relaxation of epitaxial SiGe layers on Si(100) improved by hydrogen implantation", Mantl et al., Nuclear Instruments and Methods in Physics Research B 147 (1999) 29-34.

"Cavity-dislocation interactions in Si-Ge and implications for heterostructure relaxation", Follstaedt et al., Appl. Phys. Lett. 69 (14), Sep. 30, 1996.

* cited by examiner

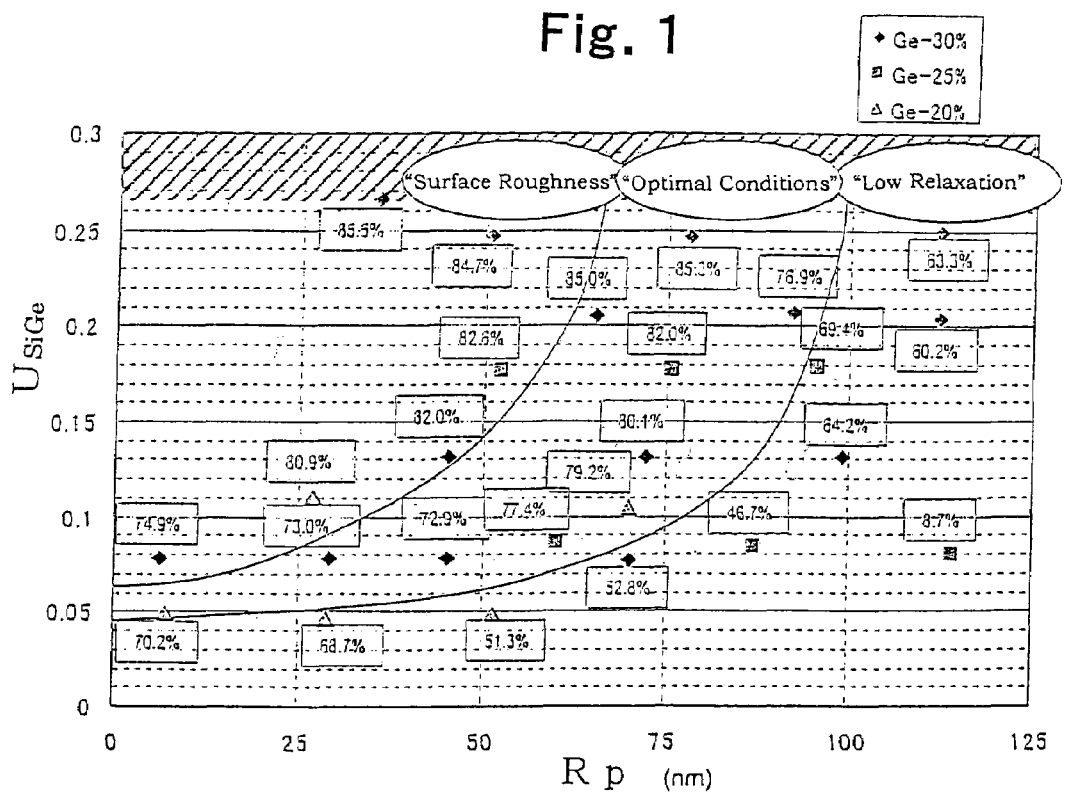
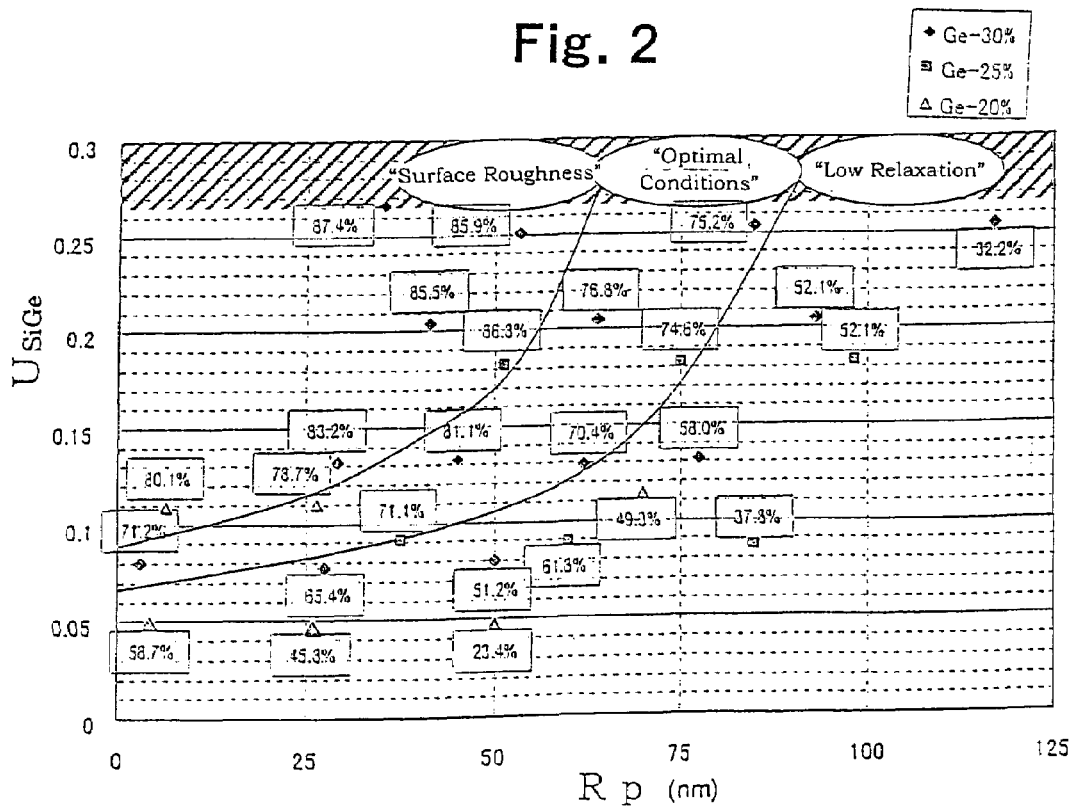

Relaxation Ratio = 82.6%  Ge Concentration = 0.247

Relaxation Ratio = 80.1%  Ge Concentration = 0.283

Relaxation Ratio = 8.7%  Ge Concentration = 0.236

Relaxation Ratio = 77.4%   Ge Concentration = 0.246

Relaxation Ratio = 81.2%   Ge Concentration = 0.197

Relaxation Ratio = 77.9%   Ge Concentration = 0.241 ately, an upper layer Si film
METHOD FOR IMPROVING A SEMICONDUCTOR SUBSTRATE HAVING SIGE FILM AND SEMICONDUCTOR DEVICE MANUFACTURED BY USING THIS METHOD

CROSS-REFERENCE TO RELATED APPLICATION

This application is related to Japanese application No. 2002-241010 filed on Aug. 21, 2002, whose priority is claimed under 35 USC § 119, the disclosure of which is incorporated by reference in its entirety.

BACKGROUND OF THE INVENTION

1. Field of the Invention

The present invention relates to a method for improving a semiconductor substrate having a SiGe film wherein the quality of the SiGe film is improved in regard to the surface condition, to the crystallinity and to relaxation of lattice distortion in the semiconductor substrate wherein the SiGe film is formed on a Si or SOI substrate, further, it relates to a semiconductor device manufactured by using a semiconductor substrate of which the quality has been improved.

2. Description of Related Art

A method is known wherein a distorted SiGe film having a lattice constant differing from that of Si is formed on a Si substrate in a virtual lattice form and the distortion caused within this SiGe film by the mismatch between the lattice constants of Si and SiGe is relieved through the introduction of misfit dislocations and, after that, an upper layer Si film is formed on the SiGe film as a cap layer in order to improve the mobility of electrons and holes that pass through channel regions.

This upper layer Si film is stretched by the SiGe film having a lattice constant that is greater than the Si film and, thereby, distortion is caused within the upper layer Si film and thus, the band structure is altered so as to improve carrier mobility.

A method for relaxing the distortion in a SiGe film is known wherein the thickness of the SiGe film is increased and thereby, the elastic strain energy of the SiGe film is increased so as to relax the lattice. It has been reported, for example, that by gradually increasing the Ge concentration in a SiGe film in order to form a SiGe film having a concentration gradient of approximately 1 μm, relaxation of distortion in the SiGe film can be achieved in the paper in Appl. Phys. Lett. 59 (13), 1611 (1991) by Y. J. Mii, et al.

In addition, a method is known for relaxing the distortion in a thin SiGe film formed on a Si substrate wherein an ion implantation process, such as of hydrogen, is carried out on the thin SiGe film and, after that, an annealing process is carried out at a high temperature so that layered defects that have been created in defect layers within the Si substrate cause slippage and, therefore, misfit dislocations are generated at the interface of SiGe/Si. It has been reported, for example, that relaxation of distortion can be achieved by means of hydrogen ion implantation in the paper in Appl. Phys. Lett. 76 (24), 3552 (2000) by H. Trinkaus, et al.

According to a method for achieving lattice relaxation by forming a thick SiGe film so as to increase the elastic strain energy of the SiGe film, however, the SiGe film exceeds the critical film thickness needed to gain perfect crystallinity of the SiGe film and, therefore, a very great number of defects occur in the SiGe film.

In addition, in the case of a thick film the film grows while distortion is relaxed by itself and, therefore, roughness, referred to as cross hatching, occurs at intervals of several tens of μm on the surface of the SiGe film such that the film cannot be used as it is as a semiconductor substrate and, therefore, a flattening process, such as a CMP process, becomes essential and another SiGe film must be grown on the surface of the SiGe film on the substrate on which the flattening process has been carried out.

On the other hand, according to a method for relaxing lattice distortion in a thin SiGe film by carrying out a hydrogen ion implantation process and a high temperature annealing process so as to generate misfit dislocations at the interface of SiGe/Si, the crystallinity is poor even though the distortion is sufficiently relaxed and the distortion can be relaxed without fail. Also, the surface condition of the SiGe film is worsened. Therefore, this method is not necessarily an effective method for improving quality.

That is to say, there is a problem that it is difficult to gain a sufficient distortion relaxation ratio while maintaining a good surface condition and a good crystallinity because the surface condition, the crystallinity and the distortion relaxation ratio greatly change depending on the film conditions of the SiGe film on which processes are carried out, even though the hydrogen ion implantation conditions, such as ion implantation energy and amount of implanted ions (dose), are kept constant.

Here, the distortion relaxation ratio is found according to the following equation [1].

$$R = \frac{a_{//}(x) - a_{//}(Si)}{a_{//}(SiGe) - a_{//}(Si)} \quad [1]$$

R indicates the relaxation ratio of lattice distortion in the SiGe film, $a_{//}(Si)$ and $a_{//}(SiGe)$ are the (001) lattice constants of Si and of SiGe, respectively, in the condition of complete lattice relaxation and $a_{//}(x)$ is the (001) lattice constant of the actually measured SiGe layer. In the case of $a_{//}(x)=a_{//}(SiGe)$, the lattice is in the condition of complete relaxation where the relaxation ratio is 100%. The case of $a_{//}(x)=a_{//}(Si)$ indicates the condition of complete lattice match with the Si substrate where the relaxation ratio is 0%.

SUMMARY OF THE INVENTION

Therefore, the present invention is aimed to provide a method for determining the relationship between the film condition of a thin SiGe film and the hydrogen ion implantation condition for the achievement of a sufficient distortion relaxation ratio, of a good crystallinity and of a good surface condition in regard to the SiGe film formed on a Si or SOI substrate so that good conditions for enabling the improvement of quality of the SiGe film on the Si or SOI substrate can be determined.

According to the present invention, there is provided a method for improving a semiconductor substrate having a SiGe film on a Si or SOI substrate by using a hydrogen ion implantation and an annealing, wherein the hydrogen ion implantation comprises the steps of:

determining in advance the range of an improvement conditions by three parameters consisting of the following (1), (2) and (3), (1) an elastic strain energy $U_{SiGe}$ which depends on a Ge concentration of the SiGe film and on a thickness of the SiGe film, (2) a peak depth Rp which is a distance between a SiGe/Si interface and a peak position of hydrogen ion concentration in the Si or SOI substrate and which depends on hydrogen ion implantation energy and on the thickness of the SiGe film, and (3) an amount of hydrogen ions to be implanted;

selecting a desired improvement condition from the range of the: improvement conditions;

and determining an amount of hydrogen ions to be implanted and a hydrogen ion implantation energy.

This method for improving quality utilizes the results of an examination of the relationship between the conditions of the SiGe film formed on a Si or SOI substrate and the conditions of hydrogen ion implantation as well as, in particular, the results of an empirical examination carried out to determine which parameters among the conditions of the SiGe film and conditions for hydrogen ion implantation affect the surface condition, the crystallinity and distortion relaxation ratio.

It was found in the process of examining the above described means for solving the problems that the ranges of the parameters that can appropriately improve the quality of the surface condition, the crystallinity and the distortion relaxation ratio can effectively be represented using three parameters: elastic strain energy $U_{SiGe}$ empirically calculated from the Ge concentration and the film thickness of the SiGe film; the peak depth Rp, which is the distance between the SiGe/Si interface and the peak position of the hydrogen ion concentration in the Si calculated from the hydrogen ion implantation energy and the film thickness of the SiGe film: and the amount of implanted hydrogen ions.

Thus, data (see FIGS. 1 to 3, for example) representing the range of the conditions appropriate for improving quality using these three parameters is determined in advance, and selecting the desired improvement condition from said range, and determining an amount of hydrogen ions to be implanted and a hydrogen ion implantation energy.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIG. 1 is a Rp-$U_{SiGe}$ graph showing ranges of appropriate quality improvement conditions defined according to a method for improving a semiconductor substrate according to the present invention wherein the amount of hydrogen ions to be implanted, which is a sub-parameter, is $3\times10^{16}$ $H^+/cm^2$;

FIG. 2 is a Rp-$U_{SiGe}$ graph showing ranges of appropriate quality improvement conditions defined according to the method of present invention wherein the amount of implanted hydrogen ions is $2\times10^{16}$ $H^+/cm^2$;

DESCRIPTION OF THE PREFERRED EMBODIMENTS

Figure 3:
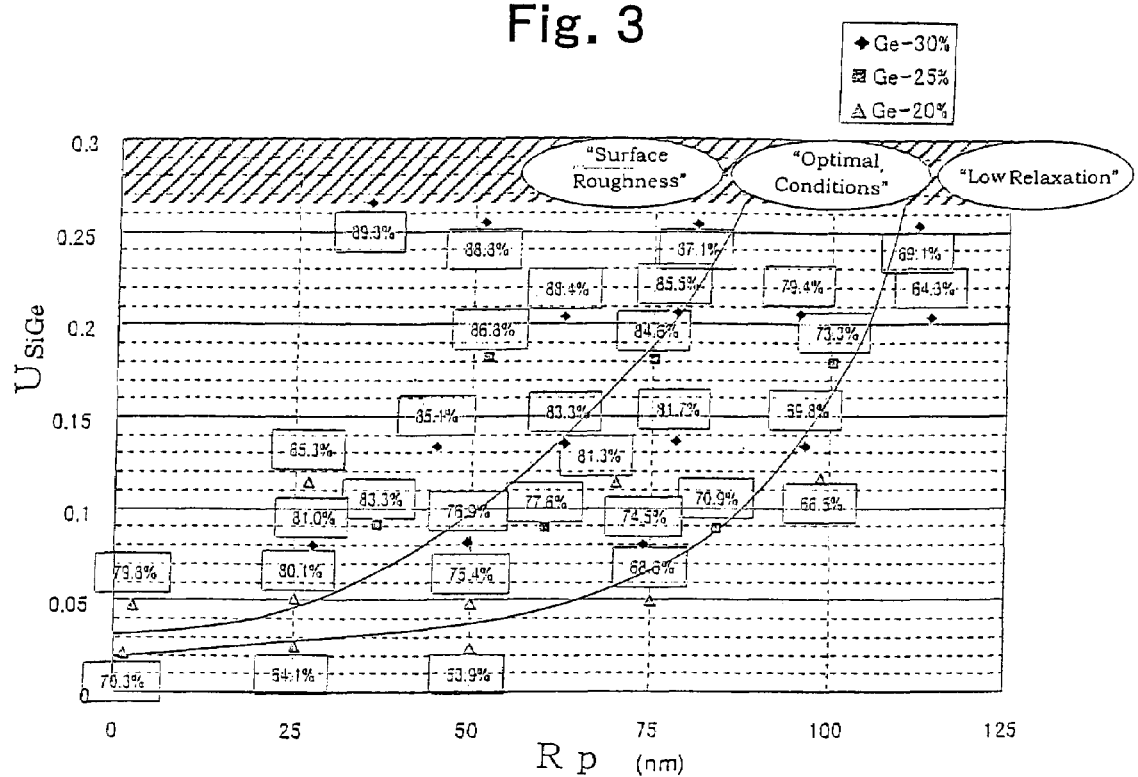
FIG. 3 is a Rp-$U_{SiGe}$ graph showing ranges of appropriate quality improvement conditions defined according to the method of present invention wherein the amount of implanted hydrogen ions is $4\times10^{16}$ $H^+/cm^2$.

As described above, the present invention achieves an improvement in the quality of the surface condition, crystallinity and relaxation of lattice distortion of a SiGe film by implementing a hydrogen ion implantation and an annealing on a semiconductor substrate formed of the SiGe film on a Si substrate or on an SOI substrate.

According to the present invention, a semiconductor substrate formed of a SiGe film on a Si substrate or on an SOI substrate is used.

In the case of a Si substrate, though a single crystal Si substrate is preferable, other Si substrates, such as a polycrystal Si substrate may be used as long as a SiGe film can be grown on the substrate in a heteroepitaxial manner. In addition, in the case of an SOI substrate, any SOI substrate may be used in the same manner as long as a SiGe film can be grown on the Si layer on the SOI substrate in an epitaxial manner.

The SiGe film may be formed in any type of unit as long as the SiGe film is a heteroepitaxially grown film formed on Si and, for example, a SiGe film having a desired Ge concentration and having a desired film thickness can be formed in a low pressure chemical vapor deposition unit (LPCVD) that utilize silane gas ($SiH_4$) and germane gas ($GeH_4$) as material gases.

The hydrogen ion implantation is carried out using a known ion implantation unit. At this time at least the amount of implemented hydrogen ions (dose) and the hydrogen ion implantation energy can be appropriately altered as parameters for ion implantation.

The annealing after the hydrogen ion implantation is carried out using a heat processing furnace wherein the introduction of atmospheric gases such as nitrogen, hydrogen and argon is possible. The annealing temperature is preferably about 700° C. to about 900° C. and it is preferable to carry out the annealing at, for example, about 800° C.

In addition, as for determination of the surface condition of the SiGe film of which the quality has been improved according to the present invention, the surface is observed using a Nomarski microscope in order to determine the quality according to the existence of local peeling or cross hatching. In addition, the quality of the crystallinity and the distortion relaxation ratio is determined by carrying out an X-ray diffraction (XRD) analysis.

Next, the elastic strain energy and the the peak depth Rp, which is the distance between the SiGe/Si interface and the peak position of the hydrogen ion concentration in the Si, used for representing the range of the predetermined appropriate conditions for quality improvement are described.

A SiGe film (Ge concentration; x, thickness of SiGe film; h) in the condition of complete lattice match with a Si substrate has an elastic strain energy per unit area (normalized elastic strain energy as described below) found according to the following equation [2].

$$u_{sige} = 2\mu\left(\frac{1+v}{1-v}\right)h\varepsilon //^2 \left(\varepsilon // = 0.0417x, i = \frac{E}{1+i}\right) \quad [2]$$

Here, $U_{SiGe}$ is the elastic strain energy of a SiGe film per unit area, v is the Poisson's ratio of SiGe, E is the Young's modulus and $\varepsilon //$ is the amount of distortion in (001) SiGe lattice.

Here, the elastic strain energy of a Ge film, in the condition wherein the Ge film made of 100% Ge with a film thickness of 100 nm is in the state of complete lattice match with a Si substrate, is assumed to be 1 and the normalized elastic strain energy of the SiGe film is assumed to be the normalized elastic strain energy $U_{SiGe}$ for the purpose of convenience in the following description.

In addition, the peak depth Rp, which is defined as the distance between the position of the peak concentration of the implemented hydrogen ions and the SiGe/Si interface, is uniformly determined by the film thickness of the SiGe film and by the ion implantation energy. The peak position of the hydrogen ions at the time of implantation using an ion implantation energy of 25 KeV is located, for example, at a position 250 nm from the surface of the substrate and the peak depth Rp is 50 nm from the SiGe/Si interface in the case wherein the film thickness of SiGe is 200 nm.

When the range of appropriate quality improvement conditions is represented using the three parameters: the normalized elastic strain energy $U_{SiGe}$; the the peak depth Rp; and the amount of hydrogen ion implantation, the range can be represented according to the X-Y coordinate system wherein two parameters out of the three parameters are indicated along the X and Y coordinate axes while the remaining parameter is used as a sub-parameter, which is fixed at any of a plurality of appropriate values. The normalized elastic strain energy $U_{SiGe}$ and the the peak depth Rp, for example, are indicated along the X-Y coordinates and the amount of ion implantation is fixed at an appropriate value as a sub-parameter.

In addition, the range of appropriate quality improvement conditions may be represented according to a three-dimensional coordinate system wherein the three parameters: the normalized elastic strain energy $U_{SiGe}$; the peak depth Rp; and the amount of ion implantation, are used as the X-Y-Z coordinate axes.

A case is described below wherein the range of appropriate quality improvement conditions is represented according to two-dimensional X-Y coordinates wherein the normalized elastic strain energy $U_{SiGe}$ is indicated according to the Y coordinate and the the peak depth Rp is indicated according to the X coordinate.

In this case the pair of numeric values (Rp, $U_{SiGe}$) of elastic strain energy $U_{SiGe}$ and the the peak depth Rp becomes quality improvement condition selection parameters while the amount of ion implantation becomes a sub-parameter. Then the range of the appropriate quality improvement condition selection parameter is empirically found for every amount of hydrogen ion implantation ($2 \times 10^{16}$ H$^+$/cm$^2$, $3 \times 10^{16}$ H$^+$/cm$^2$, $4 \times 10^{16}$ H$^+$/cm$^2$, for example) so that an Rp-$U_{SiGe}$ graph having Rp and $U_{SiGe}$ as the coordinate axes is prepared and, thereby, the range of (Rp, $U_{SiGe}$) for the appropriate quality improvement conditions is determined.

This range of (Rp, $U_{SiGe}$) for appropriate quality improvement conditions for every amount of hydrogen ion implantation is empirically found according to the following method.

The amount of hydrogen ion implantation (dose) is set at, for example, $3 \times 10^{16}$ H$^+$/cm$^2$ for the SiGe film having a Ge concentration and a film thickness wherein the normalized elastic strain energy $U_{SiGe}$ is in a range of, for example, not less than 0.09 and less than 0.1 while the energy of hydrogen ion implantation is varied so that a plurality of ion implantations having differing peak depths Rp is carried out and the distortion relaxation ratio, crystallinity and the surface condition of the respective SiGe films are analyzed and, thereby, data is acquired concerning the appropriate range at which the the peak depth Rp should be set in order to implement a sufficient relaxation ratio, an appropriate crystallinity and an appropriate surface condition. Thereby, it can be understood that a sufficient relaxation ratio, an appropriate crystallinity and an appropriate surface condition can be implemented in the case wherein the peak depth Rp is in a range of, for example, 33 nm to 75 nm.

In the following data is acquired in the same manner as described above concerning varying the normalized elastic strain energies $U_{SiGe}$ and concerning varying the amounts of implanted hydrogen ions implantation in order to determine the range of the appropriate quality improvement conditions using the normalized elastic strain energy $U_{SiGe}$; the peak depth Rp; and the amount of implanted ions as parameters and the relationship between the acquired $U_{SiGe}$, Rp and amount of implanted hydrogen ions is represented by plotting the range of appropriate quality improvement conditions for every amount of hydrogen ion implantation along the coordinates axes of $U_{SiGe}$ and Rp. Thereby, the range of hydrogen ion implantation conditions is confirmed wherein a sufficient relaxation ratio, an appropriate crystallinity and an appropriate surface condition can be implemented.

FIGS. 1 to 3 are Rp-$U_{SiGe}$ graphs showing ranges of appropriate quality improvement conditions defined according to the above described method. FIG. 1 shows a case wherein the amount of implanted hydrogen ions, which is a sub-parameter, is $3 \times 10^{16}$ H$^+$/cm$^2$, FIG. 2 shows a case wherein the amount of implanted hydrogen ions is $2 \times 10^{16}$ H$^+$/cm$^2$ and FIG. 3 shows a case wherein the amount of implanted hydrogen ions is $4 \times 10^{16}$ H$^+$/cm$^2$.

(Rp, $U_{SiGe}$) in the area shown as the "optimal condition" area provides a SiGe film having an excellent surface condition, crystallinity and distortion relaxation ratio, (Rp, $U_{SiGe}$) in the area shown as the "surface roughness" area provides a film of which the surface condition is rough though the distortion relaxation ratio is excellent while (Rp, $U_{SiGe}$) in the area shown as the "low relaxation" area provides a film having an excellent surface condition and excellent crystallinity and a low distortion relaxation ratio.

Here in the figures "□" and "■" and "▲" indicate data gained by using SiGe films having Ge concentrations of approximately 30%, approximately 25% and approximately 20%, wherein "% value" indicates the distortion relaxation ratio of the respective data points. Here, some of these data points are the data described in the embodiments below.

Here in the case wherein the normalized elastic strain energy is greater than 0.266, the film thickness exceeds the critical film thickness for gaining a complete crystal of the SiGe film and, therefore, many defects occur in the SiGe film and the crystallinity becomes poor. In addition, the SiGe film grows while relaxing its own distortion and, thereby, roughness at intervals of several tens of μm, which is referred to as cross hatching, occurs on the surface of the film. Accordingly, the range wherein the normalized elastic energy exceeds 0.266 is excluded under all conditions. Thus, the range of elastic strain energy $U_{SiGe}$ for excellent quality improvement conditions is not greater than 0.266 in the present invention.

The interface between the "surface roughening" area and the "optimal condition" area as well as the interface between the "optimal condition" area and the "low relaxation" area are formed of smooth curves, respectively.

Specifically, in the case of FIG. 1 wherein the amount of implanted hydrogen ions is $3 \times 10^{16}$ H$^+$/cm$^2$, the interface between the "surface roughening" area and the "optimal condition" area is formed of a curve that passes (25 nm, 0.085), (43 nm, 0.120) and, (62 nm, 0.200) and the interface between the "optimal condition" area and the "low relaxation" area is formed of a curve that passes (25 nm, 0.050), (50 nm, 0.063) and (75 nm, 0.095).

In addition, in the case of FIG. 2 wherein the amount of implanted hydrogen ions is $2 \times 10^{16}$ H$^+$/cm$^2$, the interface between the "surface roughening" area and the "optimal condition" area is formed of a curve that passes (25 nm, 0.117), (50 nm, 0.170) and (60 nm, 0.240) and the interface between the "optimal condition" area and the "low relaxation" area is formed of a curve that passes (25 nm, 0.082), (50 nm, 0.107) and (75 nm, 0.170).

In addition, in the case of FIG. 3 wherein the amount of implanted hydrogen ions is $4 \times 10^{16}$ H$^+$/cm$^2$, the interface between the "surface roughening" area and the "optimal condition" area is formed of a curve that passes (25 nm, 0.046), (50 nm, 0.097) and (75 nm, 0.190) and the interface between the "optimal condition" area and the "low relaxation" area is formed of a curve that passes (25 nm, 0.028), (50 nm, 0.037) and (75 nm, 0.067).

Similar Rp-$U_{SiGe}$ graphs, in addition to the above described data, are gained wherein the amount of implanted hydrogen ions, which is a sub-parameter, is changed to other values and, thereby, setting of conditions may be possible while expanding the degree of freedom of selection of the quality improvement condition.

Next, the determination of the condition of hydrogen ion implantation at the time when quality improvement is carried out on a new semiconductor substrate using the Rp-$U_{SiGe}$ graphs is described.

At the time when the condition of hydrogen ion implantation is found, first, the normalized elastic strain energy $U_{SiGe}$ is calculated according to formula 2 from the Ge concentration and the film thickness of the SiGe film on which quality improvement is carried out by means of hydrogen ion implantation.

Then, the energy for hydrogen ion implantation and the amount of implanted hydrogen ions, which are set as ion implantation conditions, are provisionally set. The peak depth Rp is calculated from this provisionally set energy for hydrogen ion implantation and from the film thickness of the SiGe film so that the quality improvement condition selection parameters (Rp, $U_{SiGe}$) are determined from the calculated $U_{SiGe}$ and Rp.

Next, these quality improvement condition selection parameters (Rp, $U_{SiGe}$) and the range of (Rp, $U_{SiGe}$) for excellent quality improvement conditions of the Rp-$U_{SiGe}$ graph corresponding to the provisionally set amount of implanted ions are compared so as to determine whether or not the quality improvement condition selection parameters (Rp, $U_{SiGe}$) are in the range of the excellent quality improvement condition selections.

According to this determination, in the case wherein the parameters are within the region for excellent quality improvement conditions, these conditions for hydrogen ion implantation are determined to be excellent quality improvement conditions and, thereby, the provisionally set energy for hydrogen ion implantation and amount of implanted hydrogen ions are determined as the conditions for ion implantation.

In the case wherein the parameters are not within the region for excellent quality improvement conditions, another energy for hydrogen ion implantation or another amount of implanted hydrogen ions is again provisionally set and a determination is made according to the same procedure and, subsequently, this is repeated so as to set the ion implantation conditions.

As described above, an appropriate range of ion implantation conditions made up of the energy for ion implantation and the amount of implanted hydrogen ions can be determined in regard to the conditions, for the SiGe film, the conditions being made up of the Ge concentration and the film thickness of the SiGe film.

In the following the present invention is described in detail in reference to the drawings.

Embodiment 1

Figure 4A:
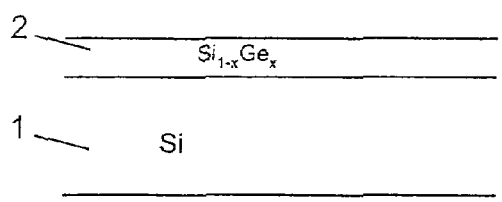
FIGS. 4(a) to (c) are diagrams showing the steps of a method for improving a semiconductor substrate according to Embodiment 1 of the present invention.
Figure 4B:
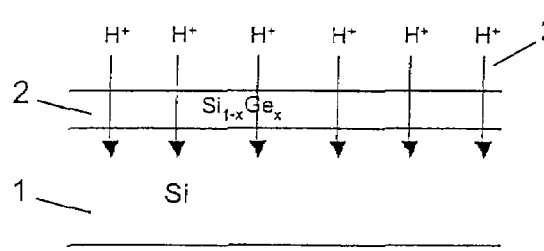
Figure 4C:
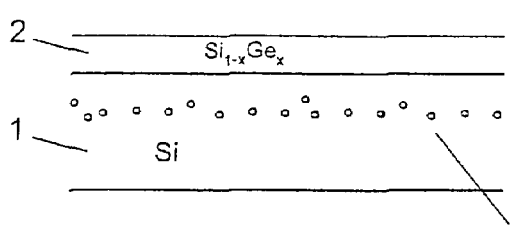

FIGS. 4(a) to (c) are diagrams showing the steps of a method for improving the quality of a semiconductor substrate according to Embodiment 1 of the present invention.

First, a Si substrate 1 was prepared. A pretreatments sulfuric acid boiling and SC-2 washing were carried out and a natural oxide film on the surface of the substrate was removed using diluted (5%) fluoric acid. Then, a semiconductor substrate was prepared wherein SiGe film 2, of which the quality was to be improved, was formed on the Si substrate 1 using a low pressure chemical vaporization unit (LPCVD) (FIG. 4(a)). The Ge concentration and the film thickness of this SiGe film 2 are determined according to the known film formation conditions. The Ge concentration and the film thickness of this SiGe film 2 were used for the calculation of Rp and $U_{SiGe}$.

Then, ion implantation of hydrogen ions 3 was carried out. Implantation conditions at this time were determined in reference to the Rp-$U_{SiGe}$ graph for each amount of implanted hydrogen ions that had been gained in advance through experiment (see FIGS. 1 to 3).

That is to say, first, the amount of implanted hydrogen ions, from among ion implantation conditions, was provisionally set (provisionally set at $3 \times 10^{16}$ H$^+$/cm$^2$, for example) and the Rp-$U_{SiGe}$ graph of the corresponding amount of implanted hydrogen ions (FIG. 1 in the case that the amount was provisionally set at $3 \times 10^{16}$ H$^+$/cm$^2$), from among a plurality of Rp-$U_{SiGe}$ graphs prepared for every amount of implanted hydrogen ions, was referred to.

The normalized elastic strain energy $U_{SiGe}$ was calculated according to the formula [2] from the Ge concentration and the film thickness of the SiGe film, of which the quality was to be improved, and the quality improvement condition selection parameters (Rp, $U_{SiGe}$) within the appropriate range for quality improvement conditions corresponding to the above value of $U_{SiGe}$ was extracted from the Rp-$U_{SiGe}$ graph so that the value of the energy for ion implantation was inversely calculated from this Rp value and from the film thickness of the SiGe film.

Here, the provisionally set value of the amount of implanted hydrogen ions is changed to another value and the reference Rp-$U_{SiGe}$ graph is changed so that the value of the energy for hydrogen ion implantation is inversely calculated according to the same procedure when a change in the ion implantation energy is desired.

The amount of implanted hydrogen ions and the energy for hydrogen ion implantation that had been set as described above were determined as the ion implantation conditions and ion implantation was carried out according to such implantation conditions (FIG. 4(b)).

Figure 8:
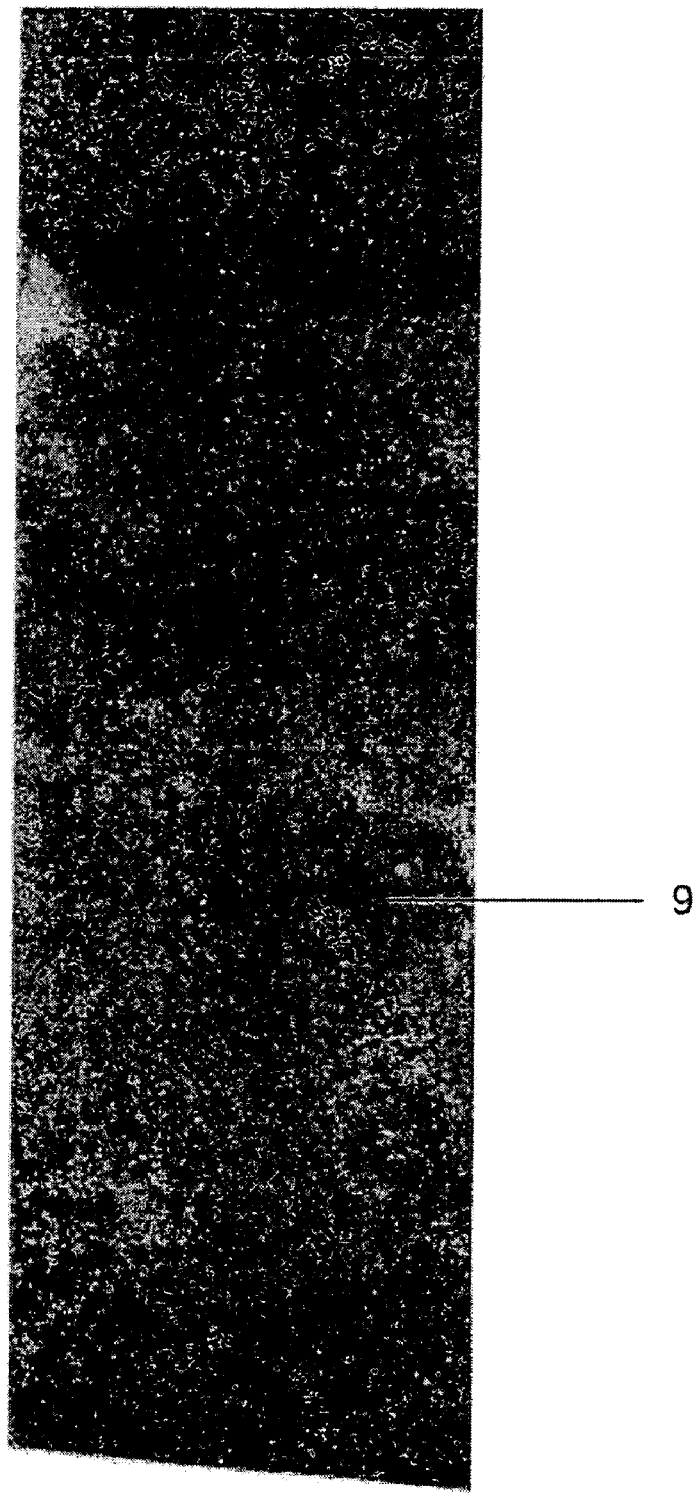
FIG. 8 is a TEM photograph of microcavities created in the vicinity of Rp according to Embodiment 1 of the present invention.

The semiconductor substrate on which ion implantation had been carried out was annealed at 800° C. for 10 minutes using a furnace in a nitrogen atmosphere so that microscopic holes, referred to as microcavities 9, were created in the vicinity of Rp (see FIG. 8). The layered defects generated by these microscopic holes caused slippage leading to misfit dislocations at the SiGe/Si interface and, thereby, lattice relaxation was able to be achieved (FIG. 4(c)).

The appropriateness of the selection of the quality improvement conditions using the Rp-$U_{SiGe}$ graphs shown in FIGS. 1 to 3 is described below in reference to the experimental data.

First, the relationship between the elastic strain energy and the surface roughness was examined.

COMPARISON EXAMPLE 1

Figure 9:
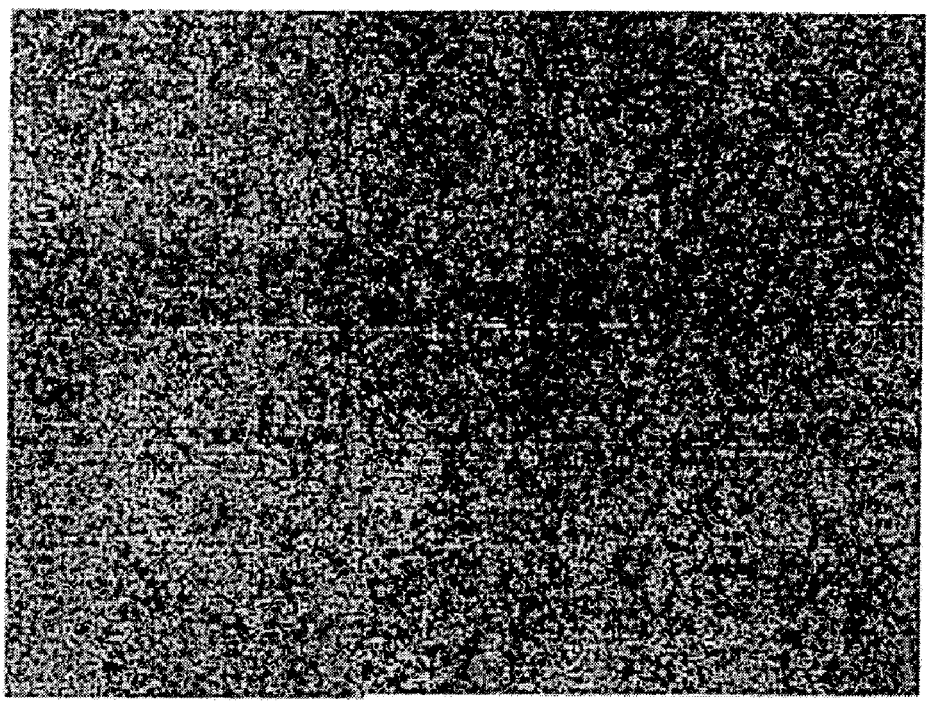
FIG. 9 is a Nomarski microscopic photograph of a surface condition of a SiGe film before ion implantation is carried out (the normalized elastic strain energy $U_{SiGe}$ is 0.266 or smaller) which is a comparison example 1 of the present invention.

A first SiGe film having a Ge concentration of 24.1% was epitaxially grown using a low pressure chemical vapor deposition (LPCVD) unit at 500° C. so as to have a film thickness of 304 nm and to have a virtual lattice form from germane (GeH$_4$) and silane (SiH$_4$) material gases on a p type silicon (100) substrate wherein as pretreatments, sulfuric acid boiling and SC-2 washing had been carried out and a natural oxide film on the surface of the substrate had been removed using dilute (5%) fluoric acid. Here the normalized elastic strain energy of the SiGe film was 0.177, which was equal to or smaller than the critical film thickness (that is to say, the normalized elastic strain energy was 0.266, or less), and the surface of the SiGe film immediately after growth was very clean, as shown in FIG. 9, wherein surface roughness referred to as cross hatching was not observed.

COMPARISON EXAMPLE 2

Figure 10:
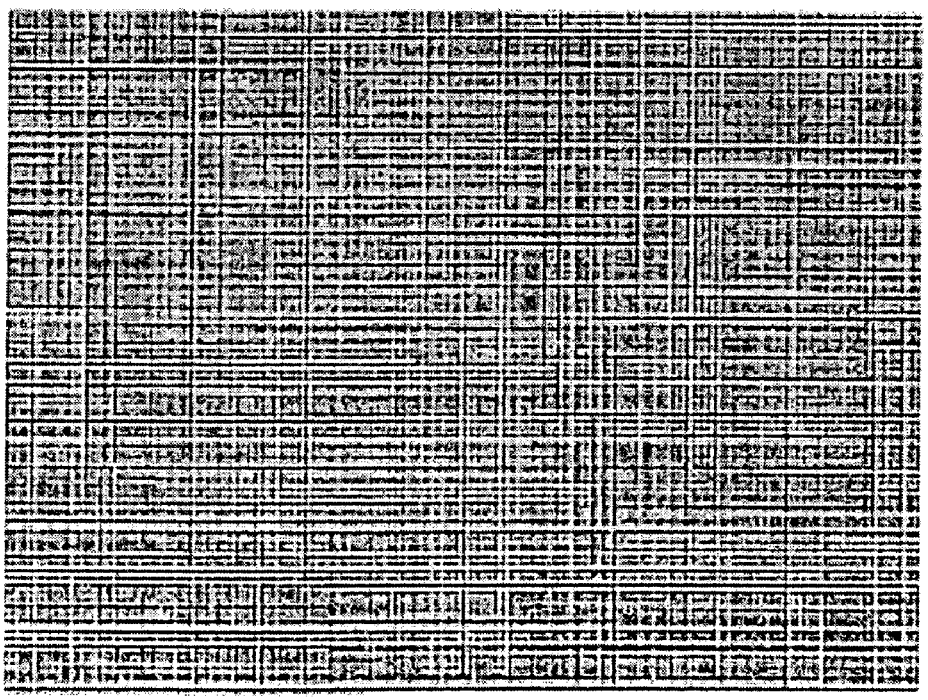
FIG. 10 is a Nomarski microscopic photograph of a surface condition of the SiGe film before the ion implantation is carried out (the normalized elastic strain energy $U_{SiGe}$ is greater than 0.266) which is a comparison example 2 of the present invention.

A first SiGe film having a Ge concentration of 29.8% was epitaxially grown in a virtual lattice form so as to have a film thickness of 321 nm at 500° C. with the same pretreatment conditions as in Comparison Example 1. Here the normalized elastic strain energy of the SiGe film was 0.285, which exceeded the critical film thickness. In this case, surface roughness, which is referred to as cross hatching, was observed to be significant on the surface of the SiGe film immediately after the SiGe film had been grown, as shown in FIG. 10.

Surface roughness was observed as described above in the case wherein the normalized energy was greater than 0.266.

Next, quality improvement conditions in the respective areas: "surface roughness"; "optimal conditions"; and "low relaxation" were examined concerning FIG. 1, which is an $Rp-U_{SiGe}$ graph in the case wherein the amount of implanted ions was $3\times10^{16}$ $H^+/cm^2$.

COMPARISON EXAMPLE 3

A hydrogen ion implantation in an amount (dose) of implanted hydrogen ions of $3\times10^{16}$ $H^+/cm^2$ was carried out at a tilt angle of 7° using an implantation energy of 32 KeV on a SiGe/Si substrate having a Ge concentration of 24.1%, having a film thickness of 304 nm and having distortion, which had been formed according to the conditions of Comparison Example 1, that is to say, in the condition wherein no surface roughness had been caused on the SiGe film.

Figure 11:
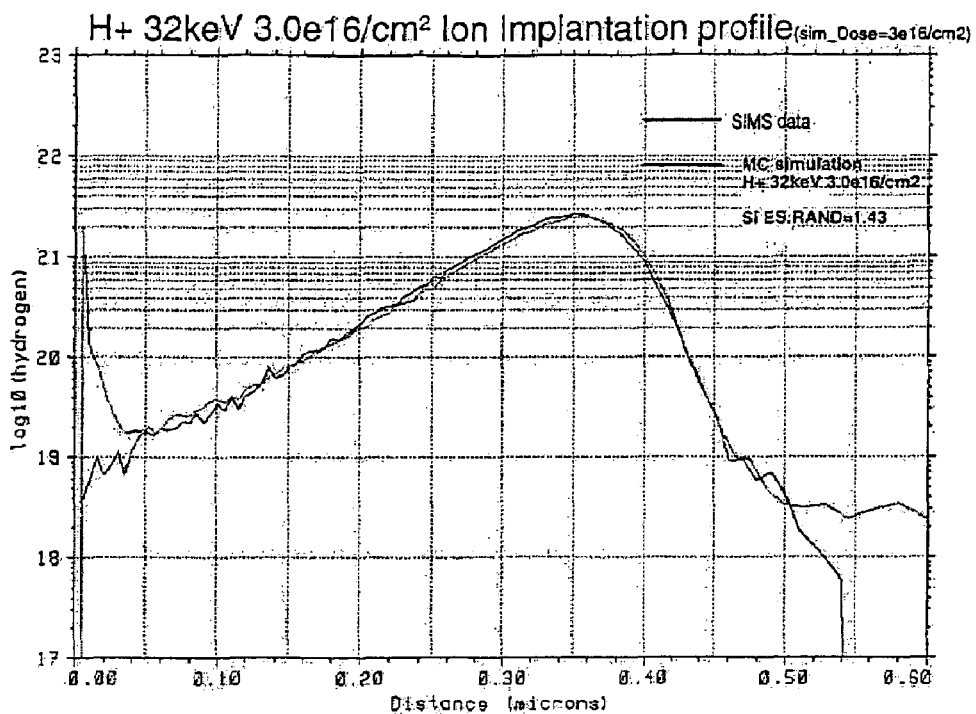
FIG. 11 is a graph of comparison data between SIMS data and results of Monte Carlo Simulation of ion implantation profile data, for determining the the peak depth Rp of hydrogen ions which is a comparison example 3 of the present invention.
Figure 12:
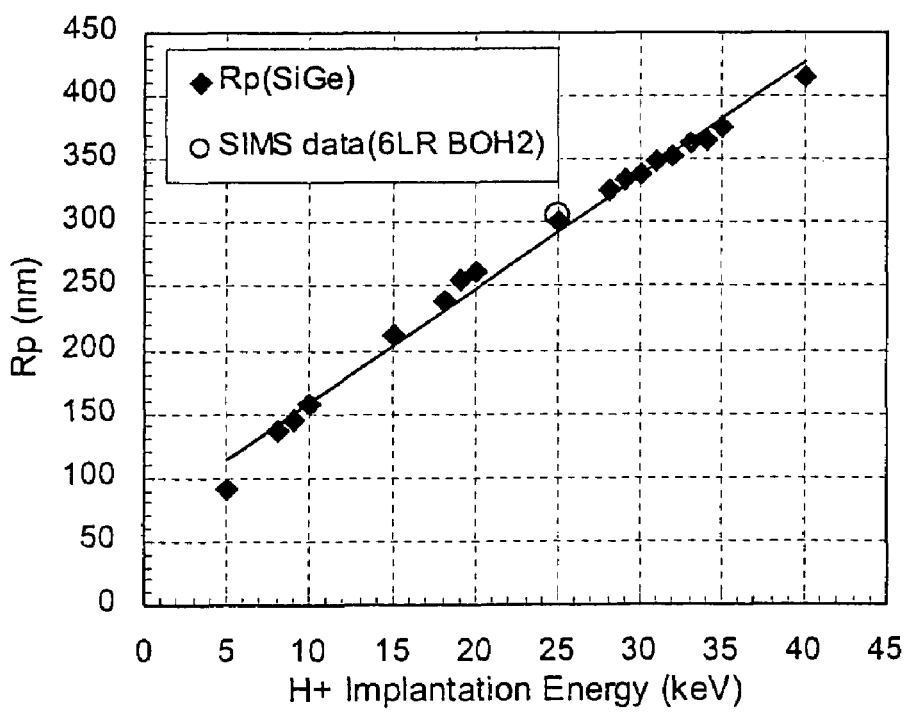
FIG. 12 is a plan view of the relationship between the the peak depth Rp of hydrogen ions and the ion implantation energy for determining the the peak depth Rp of hydrogen ion which is a comparison example 3 of the present invention.

It was understood, according to the Monte Carlo simulation (see FIG. 11) that was integrated corresponding to the result of SIMS, that the ion implantation conditions at this time allow the the peak depth Rp of hydrogen ions to be at a position 356 nm from the surface of the substrate, that is to say, at a position (from 356 nm to 304 nm) in the Si substrate that is 52 nm away from the SiGe/Si interface (see FIG. 12).

The substrate in which hydrogen ions had been implanted was annealed at 800° C. for 10 minutes using a furnace in an $N_2$ atmosphere so as to generate microcavities 9 in the vicinity of Rp as shown in FIG. 8 and, thereby, the generated layered defects caused slippage so that misfit dislocations occured in the SiGe/Si interface and lattice relaxation occured.

(Rp, $U_{SiGe}$), at this time, which is a point (52 nm, 0.177) in the $Rp-U_{SiGe}$ graph of FIG. 1, is in the "surface roughness" region located at a position that is closer to the SiGe/Si interface than is the "optimal condition" region in FIG. 1.

Figure 13:
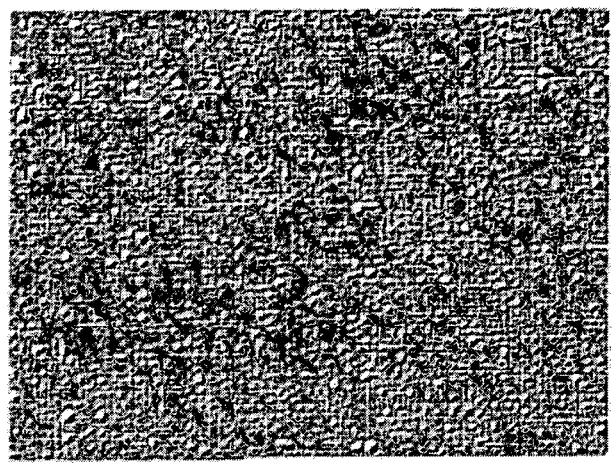
FIG. 13 is a plan view of a Nomarski microscopic photograph of a surface condition of the SiGe film after the ion implantation is carried out (a relaxation ratio is sufficient while a surface of the SiGe film is rough) which is a comparison example 3 of the present invention.

Surface roughness caused by local peeling of the SiGe film from the Si substrate was significantly observed as shown in FIG. 13 when the surface of the SiGe film wherein the distortion had been relaxed was observed using a Nomarski microscope.

Figure 16:
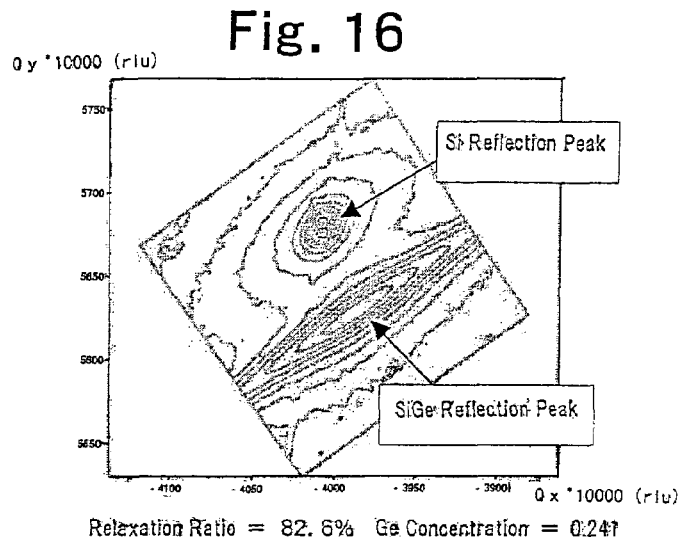
FIG. 16 is a result of an X-ray diffraction (XRD) analysis of a surface condition of the SiGe film after the ion implantation is carried out (the relaxation ratio is sufficient while the surface is rough) which is a comparison example 3 of the present invention.
Figure 19:
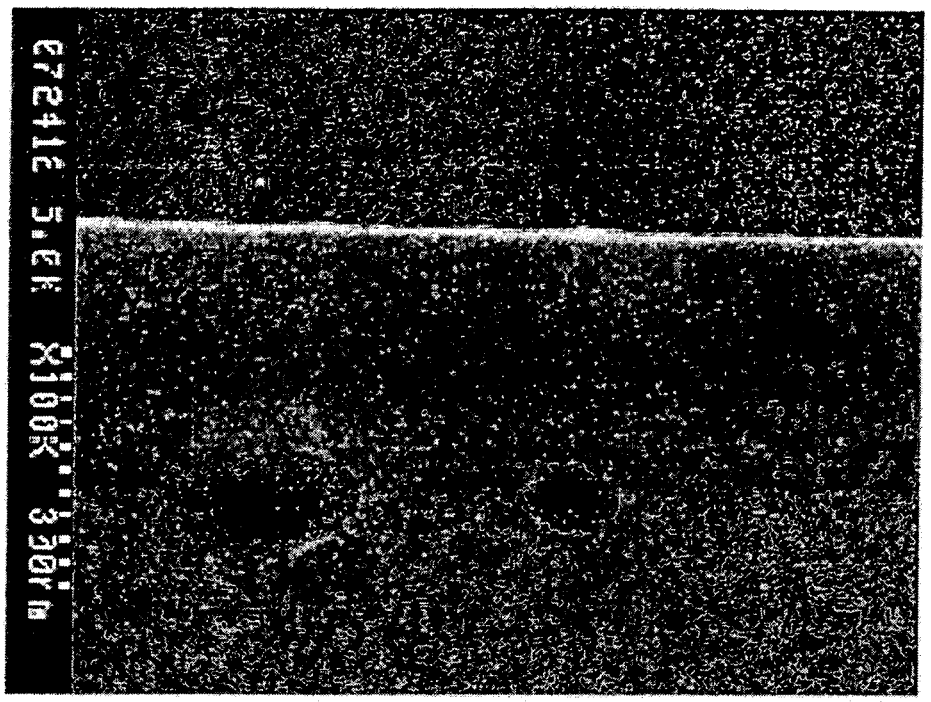
FIG. 19 is a SEM photograph of a cross section of the SiGe film after the ion implantation is carried out (the relaxation ratio is sufficient while the surface is rough) which is a comparison example 3 of the present invention.

Surface roughness was observed under such conditions because microcavities 9 had significantly grown in the SiGe/Si interface (see FIG. 19). Though the SiGe film was sufficiently relaxed such that the distortion relaxation ratio thereof was 82.6% as shown in FIG. 16, the peak of SiGe was blurred indicating a very poor crystallinity, according to XRD analysis of the (224) surface of the SiGe film, of which the distortion had been relaxed in accordance with the above described conditions.

EXAMPLE 1

Next, a first SiGe film having a Ge concentration of 28.8% was epitaxially grown, using a low pressure chemical vapor deposition (LPCVD) unit at 500° C. so as to have a film thickness of 158 nm and to have a virtual lattice form, from germane ($GeH_4$) and silane ($SiH_4$) material gases on a p type silicon (100) substrate on which the same pretreatments as in Comparison Examples 1 to 3 had been carried out.

The normalized elastic strain energy of the SiGe film at this time was 0.131, which was equal to or smaller than the critical film thickness (that is to say, the normalized elastic strain energy was 0.266, or less). A hydrogen ion implantation resulting in an amount of implanted hydrogen ions of $3\times10^{16}$ $H^+/cm^2$ was carried out on this distorted SiGe/Si substrate using an implantation energy of 18 KeV at a tilt angle of 7°.

The peak depth Rp of the hydrogen ions under such implantation conditions is located at a position in the Si substrate 72 nm away from the SiGe/Si interface according to the Monte Carlo simulation as described above (see FIG. 12). The substrate in which the hydrogen ions had been implanted was annealed at 800° C. for 10 minutes using a furnace in an $N_2$ atmosphere.

(Rp, $U_{SiGe}$), at this time, is a point (72 nm, 0.131) in the $Rp-U_{SiGe}$ graph of FIG. 1, which is located at a position within the "optimal condition" region.

Figure 14:
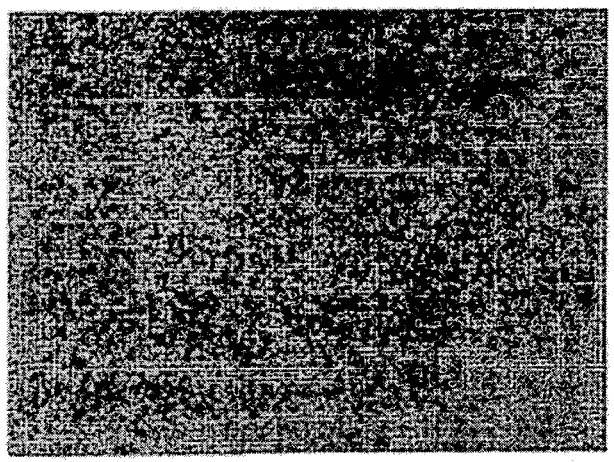
FIG. 14 is a Nomarski microscopic photograph of a surface condition of the SiGe film after the ion implantation is carried out (the relaxation ratio is sufficient and the surface is smooth) which is a example 1 of the present invention.

No surface roughness was observed on the surface of the SiGe film as shown in FIG. 14 and the surface was confirmed to be very smooth when the surface of the SiGe film, wherein the distortion had been relaxed, was observed using a Nomarski microscope.

Figure 17:
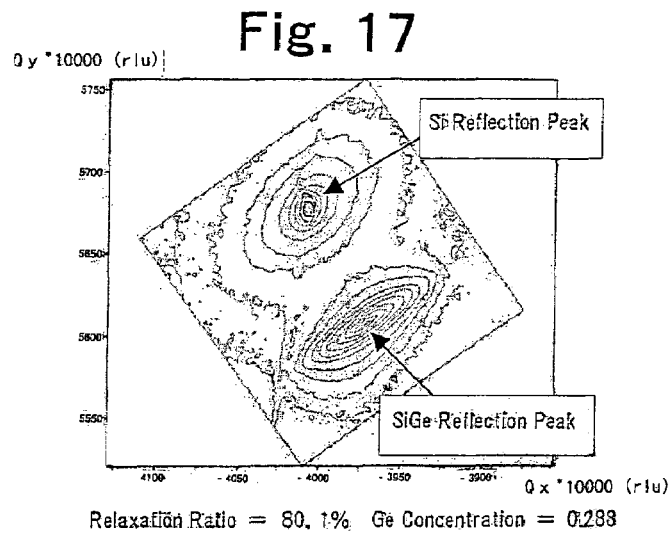
FIG. 17 is a result of an X-ray diffraction (XRD) analysis of a surface condition of the SiGe film after the ion implantation is carried out (the relaxation ratio is sufficient and the surface is smooth) which is a example 1 of the present invention.
Figure 20:
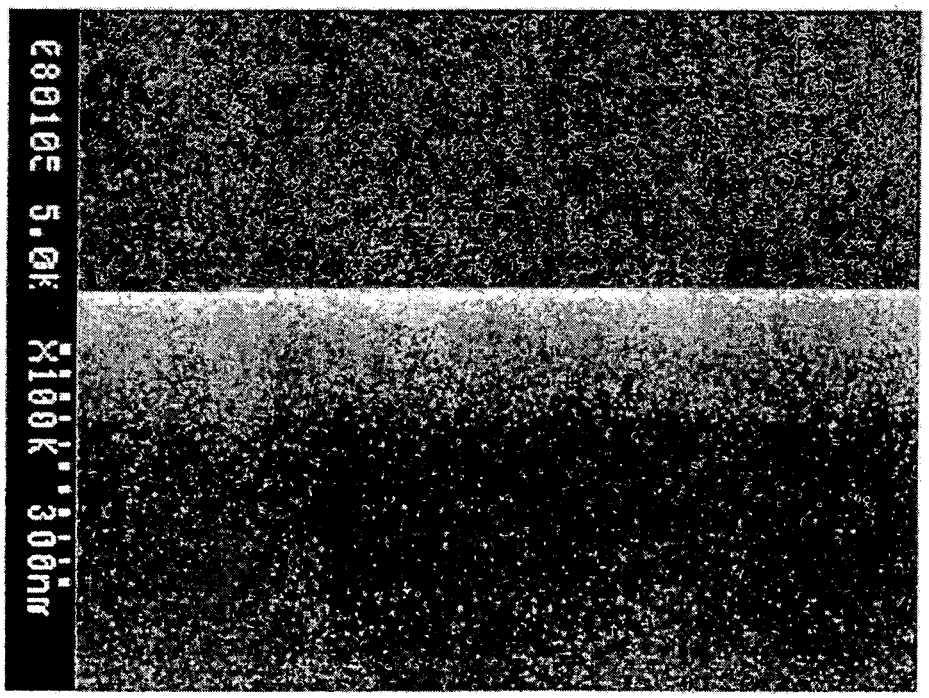
FIG. 20 is a SEM photograph of a cross section of the SiGe film after the ion implantation is carried out (the relaxation ratio is sufficient and the surface is smooth) which is a example 1 of the present invention.

FIG. 20 shows the SiGe/Si interface at this time. Microcavities did not significantly grow in the SiGe/Si interface under such implantation conditions. It was found according to XRD analysis of the (224) surface of the SiGe film, of which the distortion had been relaxed according to the above described implantation conditions, that the SiGe film had been sufficiently relaxed with the relaxation ratio of 80.1% and had a good crystallinity as shown in FIG. 17.

COMPARISON EXAMPLE 4

Next, a first SiGe film having a Ge concentration of 23.6% was epitaxially grown using a low pressure chemical vapor deposition (LPCVD) unit at 500° C. so as to have a film thickness of 143 nm and to have a virtual lattice form from germane ($GeH_4$) and silane ($SiH_4$) material gases on a p type silicon (100) substrate, on which the same pretreatments as in Comparison Examples 1 to 3 and in Example 1 had been carried out.

The normalized elastic strain energy of the SiGe film at this time was 0.079, which was equal to or smaller than the critical film thickness (that is to say, the normalized elastic strain energy was 0.266, or less).

A hydrogen ion implantation in an amount of implanted hydrogen ions of $3\times10^{16}$ $H^+/cm^2$ was carried out on this distorted SiGe/Si substrate using an implantation energy of 21 KeV at a tilt angle of 7°.

The peak depth Rp of the hydrogen ions under such implantation conditions is located at a position in the Si substrate 114 nm away from the SiGe/Si interface according to the Monte Carlo simulation (see FIG. 12). The substrate in which the hydrogen ions had been implanted was annealed at 800° C. for 10 minutes using a furnace in an $N_2$ atmosphere.

At this time, (Rp, $U_{SiGe}$) is a point (114 nm, 0.079) in the Rp-$U_{SiGe}$ graph of FIG. 1, which is located at a position within the "low relaxation" region.

Figure 15:
FIG. 15 is a Nomarski microscopic photograph of a surface condition of the SiGe film after the ion implantation is carried out (the relaxation ratio is insufficient while the surface is smooth) which is a comparison example 4 of the present invention.

No surface roughness was observed on the surface of the SiGe film as shown in FIG. 15 and it was certain that the surface was very smooth when the surface of the SiGe film wherein the distortion was relaxed was observed using a Nomarski microscope.

Figure 18:
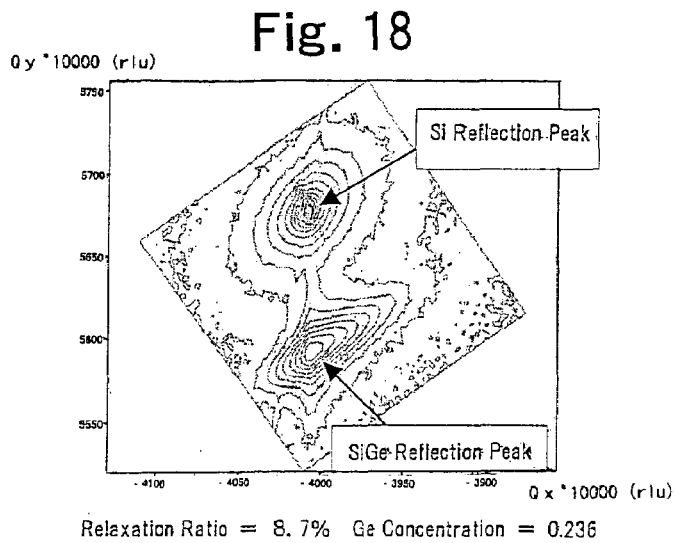
FIG. 18 is a result of an X-ray diffraction (XRD) analysis of a surface condition of the SiGe film after the ion implantation is carried out (the relaxation ratio is insufficient while the surface is smooth) which is a comparison example 4 of the present invention.

The relaxation ratio of the SiGe film was, however, shown to be only 8.7% in FIG. 18 according to XRD analysis of the (224) surface of the SiGe film wherein the distortion had been relaxed.

The interrelationships were confirmed between the respective areas: "surface roughness"; "optimal conditions"; and "low relaxation" and the relaxation ratio of the lattice distortion, the crystallinity and the surface smoothness of the Rp-$U_{SiGe}$ graph (FIG. 1) in the case wherein the amount of implanted hydrogen ions was $3 \times 10^{16}$ H$^+$/cm$^2$ as described above.

Next, quality improvement conditions of the respective areas: "surface roughness"; "optimal conditions"; and "low relaxation" were examined in FIG. 1, which is the Rp-$U_{SiGe}$ graph in the case wherein the amount of implanted ions was $2 \times 10^{16}$ H$^+$/cm$^2$.

COMPARISON EXAMPLE 5

A first SiGe film having a Ge concentration of 28.8% was epitaxially grown using a low pressure chemical vapor deposition (LPCVD) unit at 500° C. so as to have a film thickness of 248 nm to have a virtual lattice form from germane (GeH$_4$) and silane (SiH$_4$) material gases on a p type silicon (100) substrate wherein as pretreatments, sulfuric acid boiling and SC-2 washing had been carried out and the natural oxide film on the surface of the substrate had been removed using dilute (5%) fluoric acid.

Here the normalized elastic strain energy of the SiGe film was 0.206, which was equal to or smaller than the critical film thickness (that is to say, the normalized elastic strain energy was 0.266, or less).

Subsequently a hydrogen ion implantation was carried out on the distorted SiGe/Si substrate under the conditions wherein the implantation energy was 25 KeV, the dose was $2 \times 10^{16}$ H$^+$/cm$^2$ and the angle of tilt was 7°.

It was understood that the peak depth Rp of the hydrogen ions is located in the Si substrate 43 nm away from the SiGe/Si interface according to the Monte Carlo simulation (see FIG. 12).

This substrate into which hydrogen ions had been implanted was annealed at 800° C. for 10 minutes using a furnace in an N$_2$ atmosphere.

At this time, (Rp, $U_{SiGe}$) is a point (43 nm, 0.206) in the Rp-$U_{SiGe}$ graph of FIG. 2, which is located at a position within the "surface roughening" region that is closer to the SiGe/Si interface than is "optimal condition" region.

Significant surface roughness caused by local peeling of the SiGe film from the Si substrate was observed when the surface of the SiGe film wherein the distortion was relaxed was observed using a Nomarski microscope.

The relaxation ratio of the SiGe film was 85.5% indicating a sufficient relaxation while the crystallinity was very poor according to XRD analysis of the (224) surface of the SiGe film of which the distortion had been relaxed according to the above described condition.

EXAMPLE 2

A first SiGe film in a virtual lattice form was epitaxially grown at 500° C. so as to have a Ge concentration of 28.8% and so as to have a film thickness of 248 nm on a p type silicon (100) substrate wherein the same pretreatments as in Comparison Example 5 had been carried out.

A hydrogen ion implantation was carried out on this distorted SiGe/Si substrate under the conditions wherein the implantation energy was 27 KeV, the amount of implanted hydrogen ions (dose) was $2 \times 10^{16}$ H$^+$/cm$^2$ and the angle of tilt was 7°.

The peak depth Rp of the hydrogen ions is located in the Si substrate 65 nm away from the SiGe/Si interface according to the Monte Carlo simulation (see FIG. 12).

Subsequently, the substrate into which hydrogen ions had been implanted was annealed at 800° C. for 10 minutes using a furnace in an N$_2$ atmosphere.

At this time, (Rp, $U_{SiGe}$) is a point (65 nm, 0.206) in the Rp-$U_{SiGe}$ graph of FIG. 2, which is located at a position within the "optimal condition" region.

No surface roughness was observed and it was certain that the surface of the SiGe film was very smooth when the surface of the SiGe film wherein the distortion was relaxed was observed using a Nomarski microscope.

It was found that the relaxation ratio of the SiGe film was 76.8% indicating a sufficient relaxation and that the crystallinity was excellent according to XRD analysis of the (224) surface of the SiGe film of which the distortion had been relaxed according to the above described condition.

COMPARISON EXAMPLE 6

Next, a distorted SiGe/Si substrate was formed by epitaxially growing a similar SiGe film to that of Comparison Example 5 and of Example 2 on a substrate wherein similar pretreatments to those of Comparison Example 5 and of Example 2 had been carried out and a hydrogen ion implantation was carried out on this distorted SiGe/Si substrate under the conditions wherein the implantation energy was 30 KeV, the amount of implanted hydrogen ions (dose) was $2 \times 10^{16}$ H$^+$/cm$^2$ and the angle of tilt is 7°.

The peak depth Rp of the hydrogen ions under this implantation condition is at a position in the Si substrate 93 nm away from the SiGe/Si interface according to the Monte Carlo simulation (see FIG. 12).

Subsequently, the substrate into which hydrogen ions had been implanted was annealed at 800° C. for 10 minutes using a furnace in an N$_2$ atmosphere.

At this time, (Rp, $U_{SiGe}$) is a point (93 nm, 0.206) in the Rp-$U_{SiGe}$ graph of FIG. 2, which is located at a position within the "low relaxation" region.

No surface roughness was observed and it was certain that the surface of the SiGe film was very smooth when the surface of the SiGe film wherein the distortion was relaxed was observed using a Nomarski microscope.

The relaxation ratio of the SiGe film was only 52.1% indicating an insufficient relaxation according to XRD analysis of the (224) surface of the SiGe film of which the distortion had been relaxed according to the above described condition.

As described above, the interrelationships between the respective regions of the Rp-$U_{SiGe}$ graph (FIG. 2) of the surface roughening, the optimal condition and the low relaxation and the relaxation ratio of the lattice distortion, the crystallinity and the surface smoothness were confirmed in the case wherein the amount of implanted hydrogen ions was $2\times10^{16}$ H$^+$/cm$^2$.

Next, the quality improvement conditions in the respective regions of the "surface roughening," the "optimal condition" and "low relaxation" were examined in FIG. 3 that is the Rp-U$_{SiGe}$ graph in the case wherein the amount of implanted ions is $4\times10^{16}$ H$^+$/cm$^2$.

COMPARISON EXAMPLE 7

A first SiGe film having a Ge concentration of 19.4% was epitaxially grown using a low pressure chemical vapor deposition (LPCVD) unit at 500° C. so as to have a film thickness of 300 nm and to have a virtual lattice form from germane (GeH$_4$) and silane (SiH$_4$) material gases on a p type silicon (100) substrate wherein as pretreatments, sulfuric acid boiling and SC-2 washing had been carried out and the natural oxide film on the surface of the substrate had been removed using dilute (5%) fluoric acid.

Here the normalized elastic strain energy of the SiGe film was 0.113, which was equal to or smaller than the critical film thickness (that is to say the normalized elastic strain energy was 0.266, or less).

Subsequently a hydrogen ion implantation was carried out on this distorted SiGe/Si substrate under the conditions wherein the implantation energy was 28 KeV, the dose was $4\times10^{16}$ H$^+$/cm$^2$ and the angle of tilt was 7°.

The peak depth Rp of the hydrogen ions is located in the Si substrate 27 nm away from the SiGe/Si interface according to the Monte Carlo simulation (see FIG. 12).

Subsequently, this substrate into which hydrogen ions had been implanted was annealed at 800° C. for 10 minutes using a furnace in an N$_2$ atmosphere.

At this time, (Rp, U$_{SiGe}$) is a point (27 nm, 0.113) in the Rp-U$_{SiGe}$ graph of FIG. 3, which is located at a position within the "surface roughening" region that is closer to the SiGe/Si interface than is "optimal condition" region.

Significant surface roughness was observed and it was certain that this was caused by local peeling of the SiGe film from the Si substrate when the surface of the SiGe film wherein the distortion was relaxed was observed using a Nomarski microscope.

The relaxation ratio of the SiGe film was 85.3% indicating a sufficient relaxation while the crystallinity was very poor according to XRD analysis of the (224) surface of the SiGe film of which the distortion had been relaxed according to the above described condition.

EXAMPLE 3

Next, a distorted SiGe/Si substrate was formed by epitaxially growing a similar SiGe film to that of Comparison Example 7 on a substrate wherein a similar pretreatments to that of Comparison Example 7 had been carried out and hydrogen ion implantation was carried out on this distorted SiGe/Si substrate under the conditions wherein the implantation energy was 33 KeV, the amount of implanted hydrogen ions (dose) was $4\times10^{16}$ H$^+$/cm$^2$ and the angle of tilt was 7°.

The peak depth Rp of the hydrogen ions under this implantation condition is at a position in the Si substrate 71 nm away from the SiGe/Si interface according to the Monte Carlo simulation (see FIG. 12).

Subsequently, the substrate into which hydrogen ions had been implanted was annealed at 800° C. for 10 minutes using a furnace in an N$_2$ atmosphere.

At this time, (Rp, U$_{SiGe}$) is a point (71 nm, 0.113) in the Rp-U$_{SiGe}$ graph of FIG. 3, which is located at a position within the "optimal condition" region.

No surface roughness was observed and it was certain that the surface was very smooth when the surface of the SiGe film wherein the distortion was relaxed was observed using a Nomarski microscope.

It was found that the relaxation ratio of the SiGe film was 81.3% indicating a sufficient relaxation and the crystallinity was excellent according to XRD analysis of the (224) surface of the SiGe film of which the distortion had been relaxed according to the above described condition.

COMPARISON EXAMPLE 8

Next, a distorted SiGe/Si substrate was formed by epitaxially growing a similar SiGe film to that of Comparison Example 7 and of Example 3 on a substrate wherein similar pretreatments to those of Comparison Example 7 and of Example 3 had been carried out and a hydrogen ion implantation was carried out on this distorted SiGe/Si substrate under the conditions wherein the implantation energy was 37 KeV, the amount of implanted hydrogen ions (dose) was $4\times10^{16}$ H$^+$/cm$^2$ and the angle of tilt was 7°.

The peak depth Rp of the hydrogen ions under this implantation condition is at a position in the Si substrate 98 nm away from the SiGe/Si interface according to the Monte Carlo simulation (see FIG. 12).

Subsequently, the substrate into which hydrogen ions had been implanted was annealed at 800° C. for 10 minutes using a furnace in an N$_2$ atmosphere.

At this time, (Rp, U$_{SiGe}$) is a point (98 nm, 0.113) in the Rp-U$_{SiGe}$ graph of FIG. 3, which is located at a position within the "low relaxation" region.

No surface roughness was observed and it was certain that the surface of the SiGe film was very smooth when the surface of the SiGe film wherein the distortion was relaxed was observed using a Nomarski microscope. The relaxation ratio of the SiGe film was only 66.5% indicating an insufficient relaxation according to XRD analysis of the (224) surface of the SiGe film of which the distortion had been relaxed.

As described above, the interrelationships between the respective regions of the Rp-U$_{SiGe}$ graph (FIG. 3) of the surface roughening, the optimal condition and the low relaxation and the relaxation ratio of the lattice distortion, the crystallinity and the surface smoothness were confirmed in the case wherein the amount of implanted hydrogen ions was $4\times10^{16}$ H$^+$/cm$^2$.

Substrates wherein SiGe films had been formed on Si substrates were used in the above described examples and comparison examples while the same results were gained in the case where SOI substrates of which the surface layers had been made of single crystal Si films were used in place of the usage of Si substrates. Here, it is necessary for the Si film of the surface layer to have a thickness greater than the distance between Rp, which is located in the Si substrate, and the SiGe/Si interface and specifically it is desirable for the Si film to have a thickness approximately 2 times greater than the peak depth Rp of the hydrogen ions.

Embodiment 2

Figure 5A:
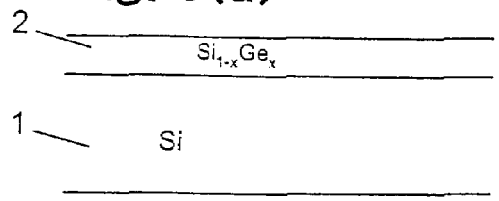
FIGS. 5(a) to (c) are diagrams showing the steps of a method for improving a semiconductor substrate according to Embodiment 2 of the present invention.
Figure 5B:
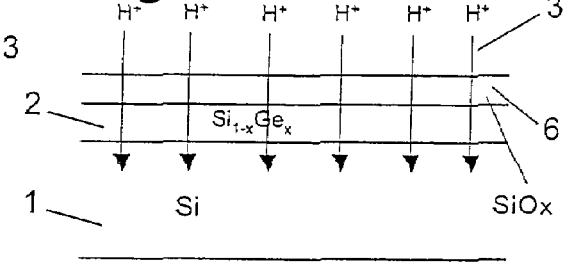
Figure 5C:
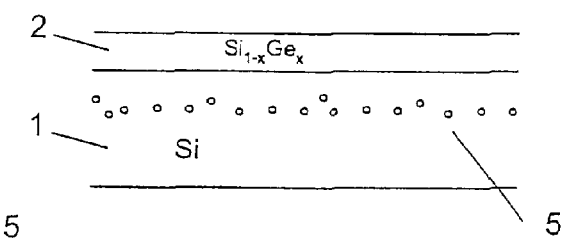

FIGS. 5(a) to (c) are diagram showings the steps of a method for improving the quality of a semiconductor substrate according to Embodiment 2 of the present invention. Here, the effects of the surface protection film were examined.

First, a first SiGe film 2 in a virtual lattice form was epitaxially grown at 500° C. on a Si substrate 1 so as to have a Ge concentration of 24.6% and so as to have a film thickness of 143 nm so that a distorted SiGe/Si substrate was formed (FIG. 5(a)).

An oxide film 6 was grown on this first SiGe film so as to have a film thickness of 20 nm and, after that, ion implantation of hydrogen ions 3 was carried out under the conditions wherein the implantation energy was 17 KeV, the amount of implanted hydrogen ions (dose) was $3\times10^{16}$ $H^+/cm^2$ and the angle of tilt was 7° (FIG. 5(b)). At this time, the peak depth Rp of the hydrogen ions is located at a position in the Si substrate 57 nm away from the SiGe/Si interface.

Oxide film 6 was removed by means of fluoric acid (HF) processing or the like, after the hydrogen ion implantation and, subsequently, this substrate into which hydrogen ions had been implanted was annealed at 800° C. for 10 minutes using a furnace in an $N_2$ atmosphere (FIG. 5(c)).

Figure 21:
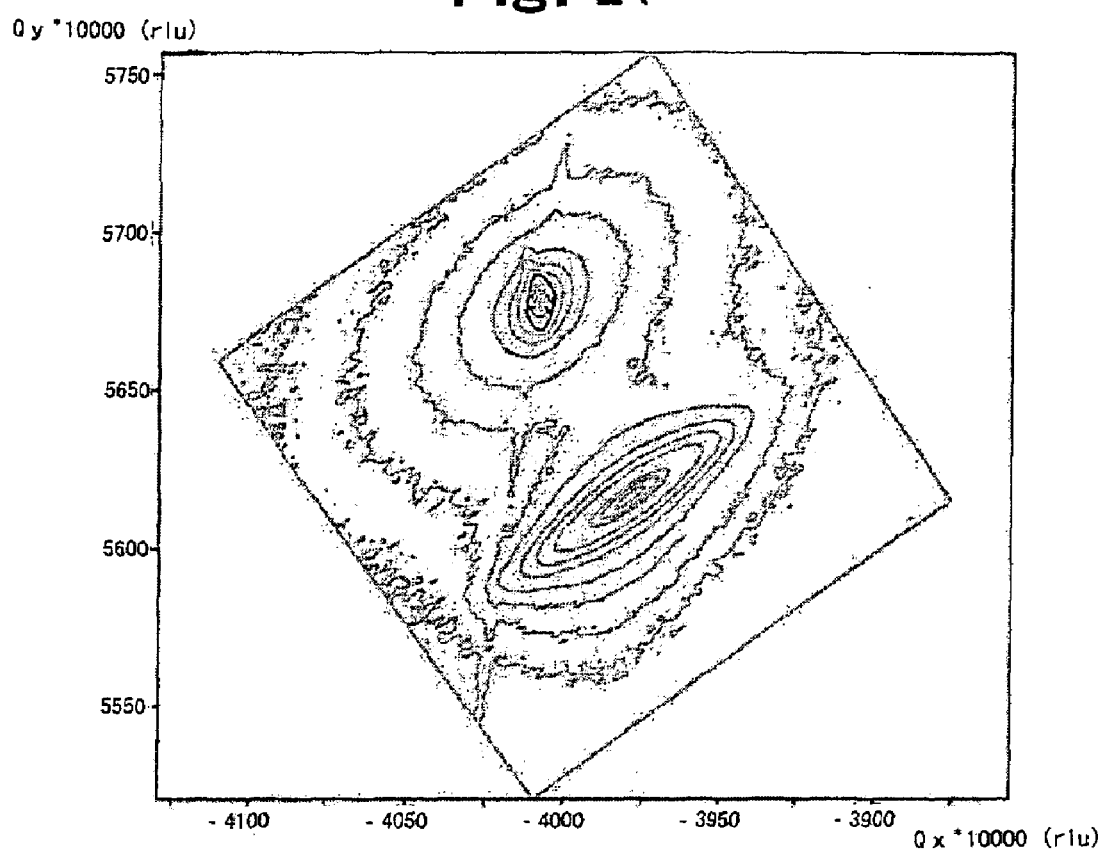
FIG. 21 is a result of an X-ray diffraction (XRD) analysis of a surface condition of the SiGe film after an oxide film is grown and then the ion implantation is carried out (the relaxation ratio is sufficient and the surface is smooth) according to Embodiment 2 of the present invention.

At this time, (Rp, $U_{SiGe}$) is within the range of the "optimal condition" of FIG. 1. It was found that the relaxation ratio of the SiGe film was 77.4% indicating a sufficient relaxation and that the crystallinity is excellent as shown in FIG. 21 according to XRD analysis of the (-2-2 4) surface of the SiGe film of which the distortion had been relaxed according to the above described condition.

Accordingly, an oxide film was formed at the time of ion implantation and, thereby, the quality of the SiGe film was improved and, in addition, impurities was able to be prevented from being mixed into the SiGe film at the time of the hydrogen ion implantation.

Here, the protection film is not limited to an oxide film and the same effects can be gained by using a nitride film or an oxide nitride film.

Embodiment 3

Next, the effects of the atmospheric gas for anneal processing in a method for quality improvement according to the present invention were examined.

$N_2$ was used as the atmospheric gas in anneal processing after hydrogen ion implantation in Embodiment 1 and in Embodiment 2 while quality improvement was carried out in the same manner using Ar and $H_2$ in place of $N_2$ in Embodiment 3. No difference was found in the relaxation ratio or in the surface condition of the SiGe film depending on the types of these gases. That is to say, it was found that any of $N_2$, Ar and $H_2$ may be used as the atmospheric gas for anneal processing.

Figure 22:
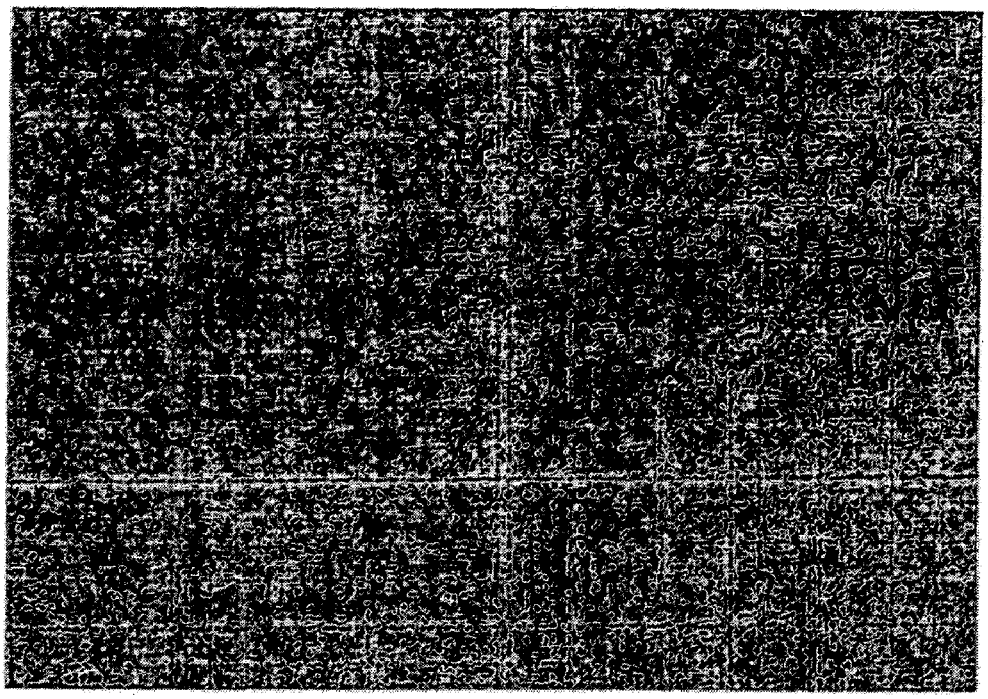
FIG. 22 is a Nomarski microscopic photograph of a surface condition of the SiGe film after the ion implantation is carried out and then annealing in an argon atmosphere is carried out (the relaxation ratio is sufficient and the surface is smooth) according to Embodiment 3 of the present invention.

A distorted SiGe/Si substrate was formed, for example, by epitaxially growing the first SiGe film in a virtual lattice form at 500° C. so as to have a Ge concentration of 19.7% and so as to have a film thickness of 250 nm. A hydrogen ion implantation was carried out on this distorted SiGe/Si substrate (normalized elastic strain energy: 0.097) within the range of the "optimal condition" in the Rp-$U_{SiGe}$ graph and the distorted SiGe/Si substrate was annealed at 800° C. for 10 minutes in an Ar atmosphere. No surface roughness was observed and the surface was smooth as shown in FIG. 22 when the surface of the SiGe film of which the distortion had been relaxed as described above was observed using a Nomarski microscope.

Figure 24:
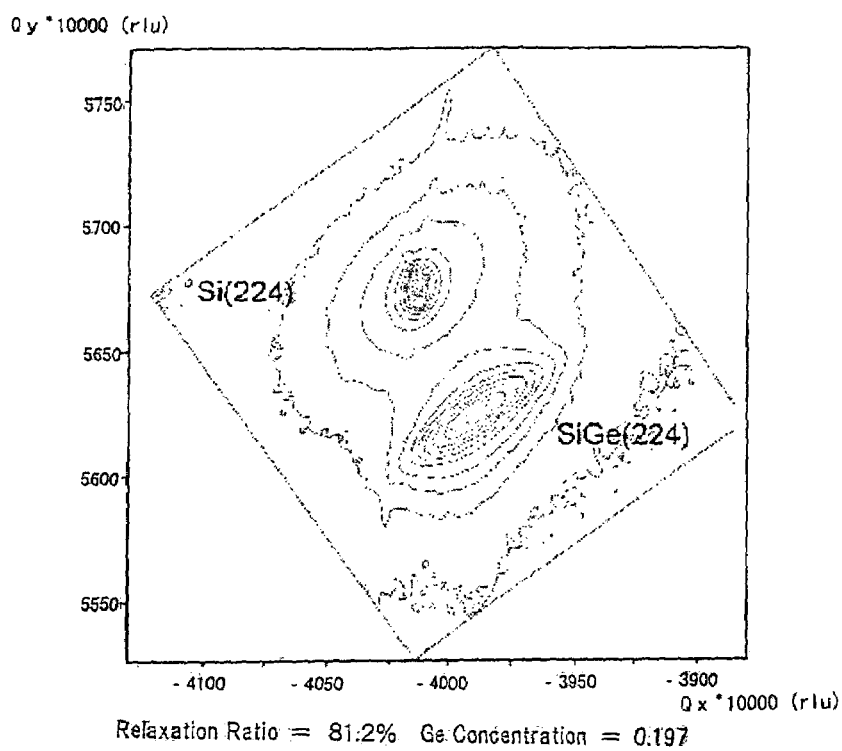
FIG. 24 is a result of an X-ray diffraction (XRD) analysis of a surface condition of the SiGe film after the ion implantation is carried out and then the annealing in the argon atmosphere is carried out (the relaxation ratio is sufficient and the surface is smooth) according to Embodiment 3 of the present invention.

In addition, it was found that the relaxation ratio of the SiGe film was 81.2% indicating a sufficient relaxation of the distortion and that the crystallinity was excellent as shown in FIG. 24 according to XRD analysis of the (-2-2 4) surface of this SiGe film.

Figure 23:
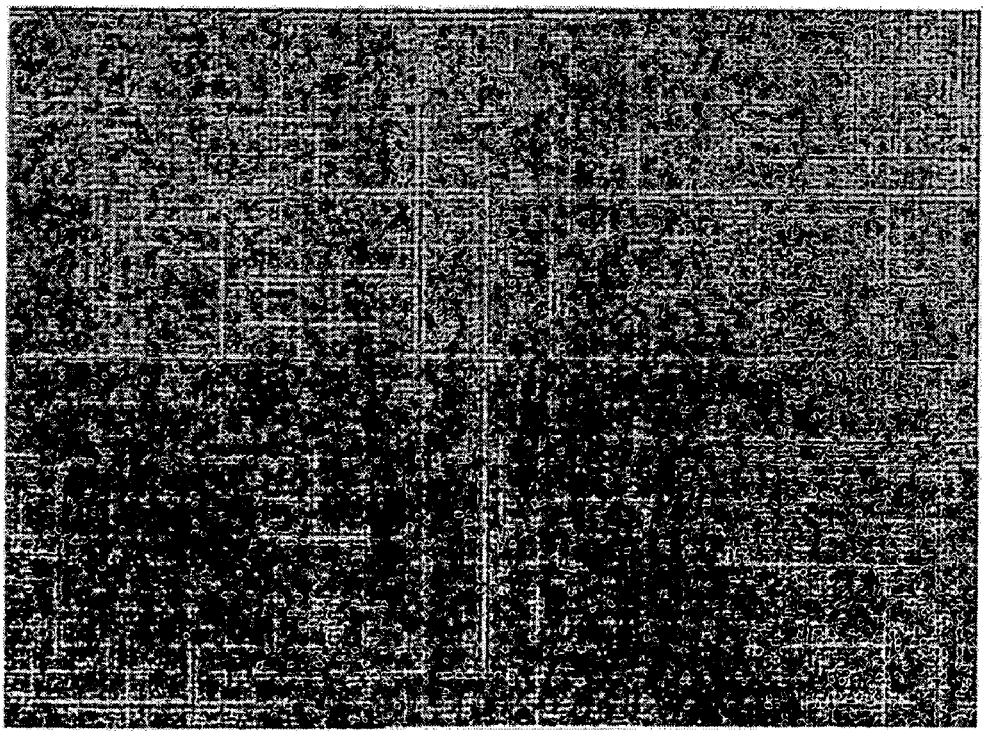
FIG. 23 is a Nomarski microscopic photograph of a surface condition of the SiGe film after the ion implantation is carried out and then annealing in a hydrogen atmosphere is carried out (the relaxation ratio is sufficient and the surface is smooth) according to Embodiment 3 of the present invention.

A distorted SiGe/Si substrate was formed by epitaxially growing the first SiGe film in a virtual lattice form at 500° C. so as to have a Ge concentration of 24.1% and so as to have a film thickness of 304 nm in the same manner as described above. Hydrogen ions were implanted into this distorted SiGe/Si substrate (normalized elastic strain energy: 0.177) within the range of optimal condition and the distorted SiGe/Si substrate was annealed at 800° C. for 10 minutes in an $H_2$ atmosphere. No surface roughness was observed as shown in FIG. 23 and the surface was very smooth when the surface of the SiGe film of which the distortion had been relaxed as described above was observed using a Nomarski microscope.

Figure 25:
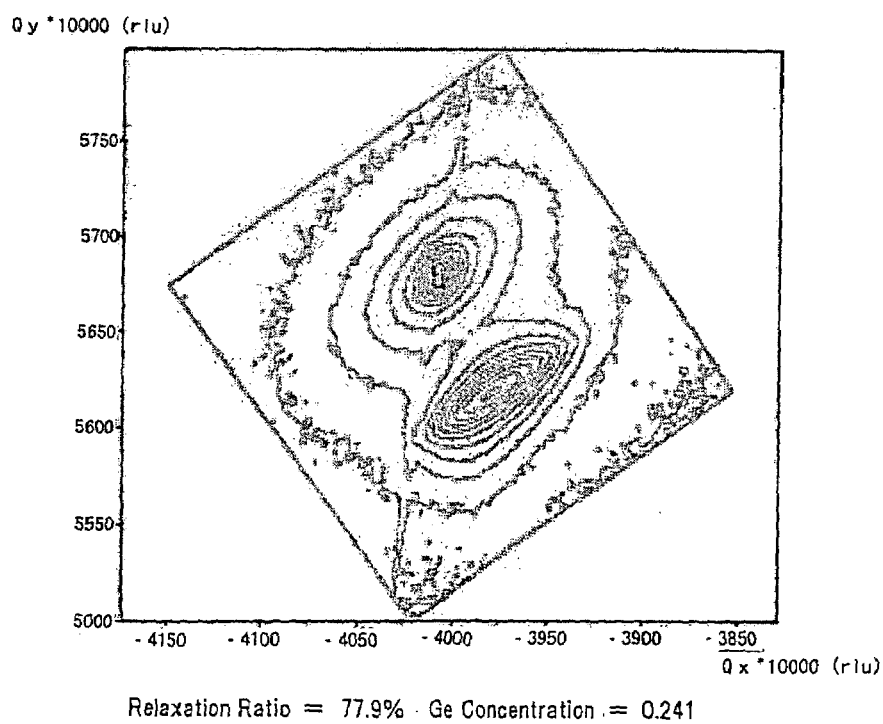
FIG. 25 is a result of an X-ray diffraction (XRD) analysis of a surface condition of the SiGe film after the ion implantation is carried out and then the annealing in the hydrogen atmosphere is carried out (the relaxation ratio is sufficient and the surface is smooth) according to Embodiment 3 of the present invention.

In addition, it was found that the relaxation ratio was 77.9% indicating a sufficient relaxation of the distortion and that the crystallinity was excellent as shown in FIG. 25 according to XRD analysis of the (-2-2 4) surface of this SiGe film.

Embodiment 4

FIGS. 6 (a) to (d) are diagrams showing the steps of a method for improving the quality of a semiconductor substrate according to Embodiment 4 of the present invention. Here the effects in the case wherein another semiconductor film is formed on the SiGe film were examined.

Figure 6A:
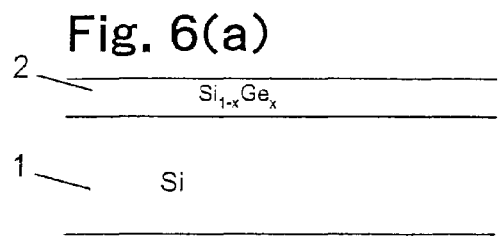
FIGS. 6(a) to (d) are diagrams showing the steps of a method for improving a semiconductor substrate according to Embodiment 4 of the present invention.

First, a distorted SiGe/Si substrate was formed by epitaxially growing the first SiGe film in a virtual lattice form at 500° C. so as to have a Ge concentration of 28.8% and so as to have a film thickness of 158 nm (FIG. 6(a)). Ion implantation of hydrogen ions 3 was carried out on this distorted SiGe/Si substrate under the conditions wherein the implementation energy was 18 KeV, the amount of implanted hydrogen ions (dose) was $3\times10^{16}$ $H^+/cm^2$ and the angle of tilt was 7° (FIG. 6(b)). The peak depth Rp of the hydrogen ions in this ion implantation condition is located at a position in the Si substrate 72 nm away from the SiGe/Si interface.

Figure 6B:
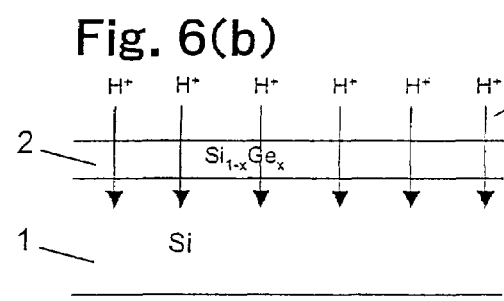
Figure 6C:
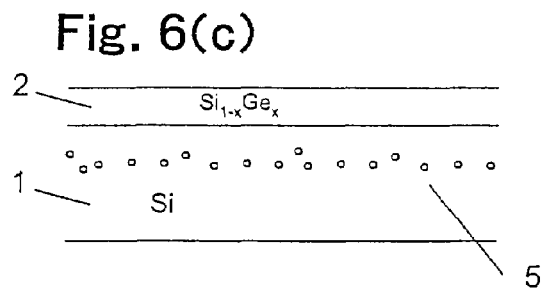

Subsequently, the substrate in which the hydrogen ions had been implemented was annealed at 800° C. for 10 minutes using a furnace in an $N_2$ atmosphere (FIG. 6(c)). At this time the value of (Rp, $U_{SiGe}$) is in the range of the "optimal condition" of FIG. 1. It was found according to XRD analysis of the (-2-2 4) surface of the SiGe film of which the distortion had been relaxed, in accordance with the above described conditions, that the relaxation ratio of the SiGe film was 80.1% indicating a sufficient relaxation, as shown in FIG. 17, and the crystallinity was excellent.

Figure 6D:
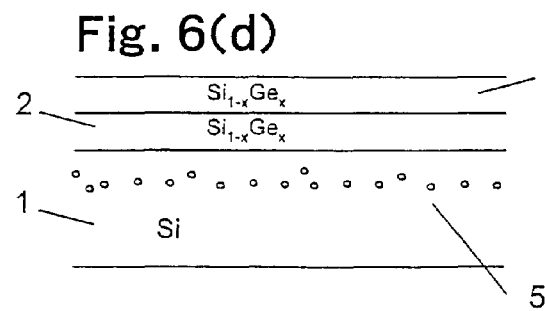

Subsequently the second SiGe film in a virtual lattice form was epitaxially grown at 500° C. so as to have a Ge concentration of 30% and so as to have a film thickness of 300 nm on the SiGe film, wherein the distortion had been relaxed (FIG. 6(d)). Thereby, the total film thickness of the first and second SiGe films became 458 nm.

The second SiGe film was layered on top of the SiGe film, wherein the distortion had been relaxed as described above and thereby, by means of a CMOS device having a high source voltage for example, the diffusion of the depletion layer region was able to reach to the interface between the first SiGe film and the Si substrate wherein misfit dislocations exist and, thereby, junction leak current was able to be prevented.

Embodiment 5

FIGS. 7(a) to (d) are diagrams showing the steps of a method for improving the quality of a semiconductor substrate according to Embodiment 5 of the present invention. Here, the effects in the case wherein a Si film was formed on a SiGe film were examined.

Figure 7A:
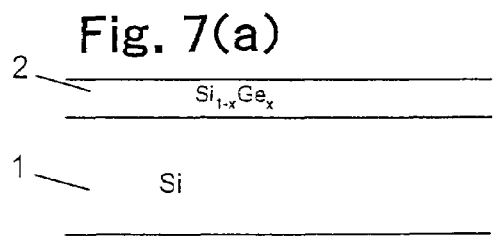
FIGS. 7(a) to (d) are diagrams showing the steps of a method for improving a semiconductor substrate according to Embodiment 5 of the present invention.
Figure 7B:
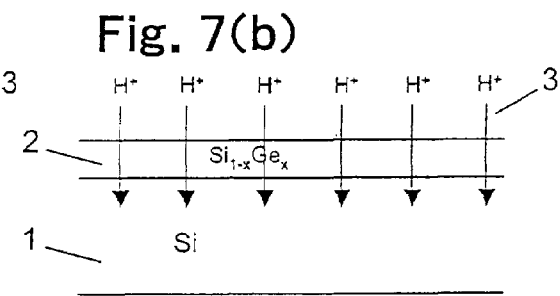

A distorted SiGe/Si substrate was formed by epitaxially growing the first SiGe film in a virtual lattice form at 500° C. so as to have a Ge concentration of 28.8% and so as to have a film thickness of 158 nm (FIG. 7(a)). Ion implantation of hydrogen ions 3 was carried out on this distorted SiGe/Si substrate under the conditions wherein the implementation energy was 18 KeV, the amount of implanted hydrogen ions (dose) was $3 \times 10^{16}$ H$^+$/cm$^2$ and the angle of tilt was 7° (FIG. 7(b)). The peak depth Rp of the hydrogen ions in this ion implantation condition is located at a position in the Si substrate 72 nm away from the SiGe/Si interface.

Figure 7C:
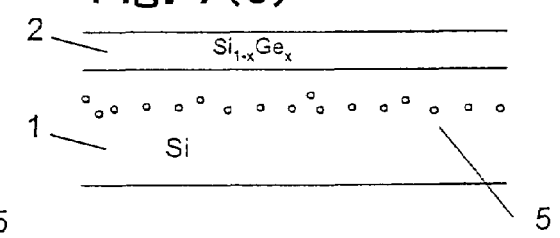

Subsequently, the substrate in which the hydrogen ions had been implemented was annealed at 800° C. for 10 minutes using a furnace in an N$_2$ atmosphere (FIG. 7(c)). At this time the value of (Rp, $U_{SiGe}$) is in the range of the "optimal condition" of FIG. 1. It was found according to XRD analysis of the (-2-2 4) surface of the SiGe film of which the distortion had been relaxed, in accordance with the above described conditions, that the relaxation ratio of the SiGe film was 80.1% indicating a sufficient relaxation and the crystallinity was excellent, as shown in FIG. 17.

Figure 7D:
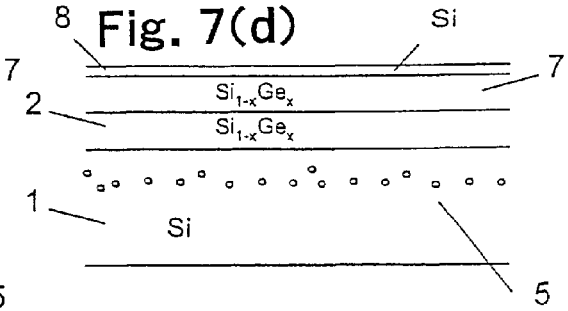

Subsequently the second SiGe film in a virtual lattice form was epitaxially grown at 500° C. so as to have a Ge concentration of 30% and so as to have a film thickness of 300 nm on the SiGe film, of which the distortion had been relaxed, and, after that, another Si film in a virtual lattice form was grown so as to have a film thickness of 20 nm (FIG. 7(d)). This Si thin film formed on the second SiGe film was formed in a virtual lattice form and, therefore, the lattice was stretched by the second SiGe film, of which the distortion had been relaxed, having a lattice constant greater than that of the Si film so that the mobility of electrons and holes in the Si thin film was increased.

Embodiment 6

Next, a MOS device was formed in a Si thin film that was similar to that of Embodiment 5 so as to inspect the functioning of the device.

First, the first SiGe film was epitaxially grown at 500° C. so as to be in a virtual lattice form, so as to have a Ge concentration of 28.8% and so as to have a film thickness of 158 nm and a distorted SiGe/Si substrate was formed wherein ion implantation of hydrogen ions was carried out on this distorted SiGe/Si substrate under conditions wherein the implantation energy was 18 KeV, the amount of implanted hydrogen ions (dose) was $3 \times 10^{16}$ H$^+$/cm$^2$ and the angle of tilt was 7°.

The peak depth Rp of the hydrogen ions under these ion implantation condition is located at a position in the Si substrate 72 nm away from the SiGe/Si interface.

Subsequently the substrate into which the hydrogen ions had been implanted was annealed at 800° C. for 10 minutes using a furnace in an N$_2$ atmosphere. At this time the value of (Rp, $U_{SiGe}$) is within the range of the "optimal condition" of FIG. 1. The second SiGe film was formed so as to have a Ge concentration of 30% and so as to have a film thickness of 300 nm and Si was grown on top of that so as to be in a virtual lattice form and so as to have a film thickness of 20 nm and, thereby, a distorted Si/SiGe/Si substrate was formed.

Figure 26:
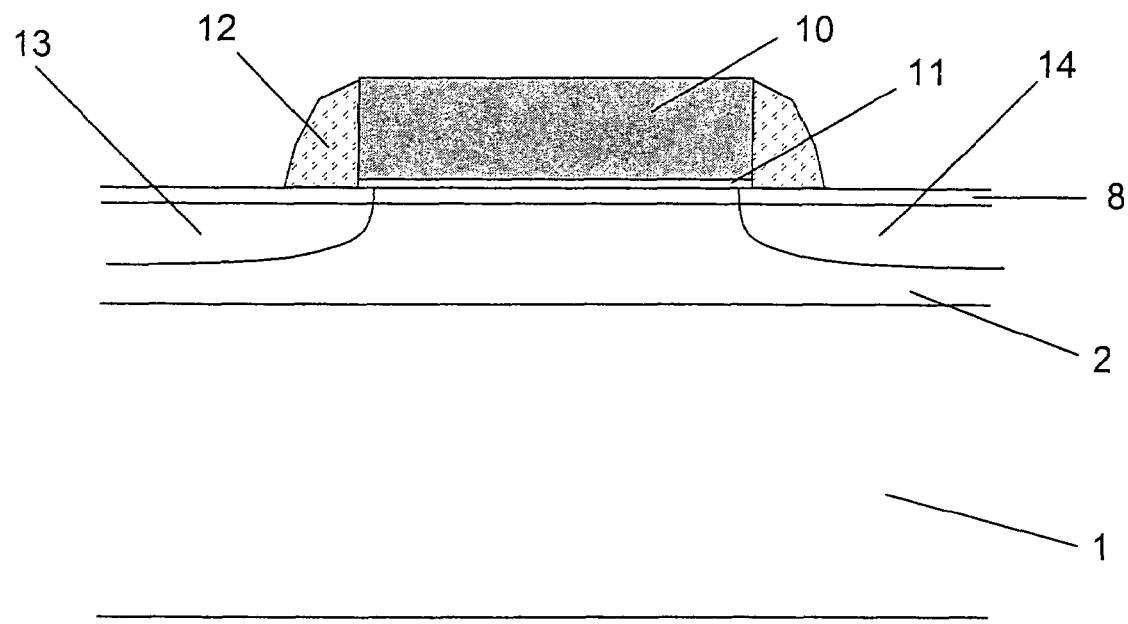
FIG. 26 is a view showing a construction of a PMOS formed on an upper layer of a Si/SiGe/Si substrate according to Embodiment 6 of the present invention.

Subsequently a PMOS having the structure shown in FIG. 26 was formed on the distorted Si/SiGe/Si substrate. A Si substrate denoted as 1, a SiGe film denoted as 2, and a Si film denoted as 8 in the figure were formed according to the above described procedure. A gate oxide film 11 and a gate electrode 10 were formed by patterning this substrate and ion implantation of boron was carried out using the gate oxide film 11 and the gate electrode 10 as a mask in a self-aligning manner and, after that, thermal diffusion was carried out and, thereby, a source 13 and a drain 14 were formed and, in addition, sidewalls 12 were formed so that the PMOS was formed.

Figure 27:
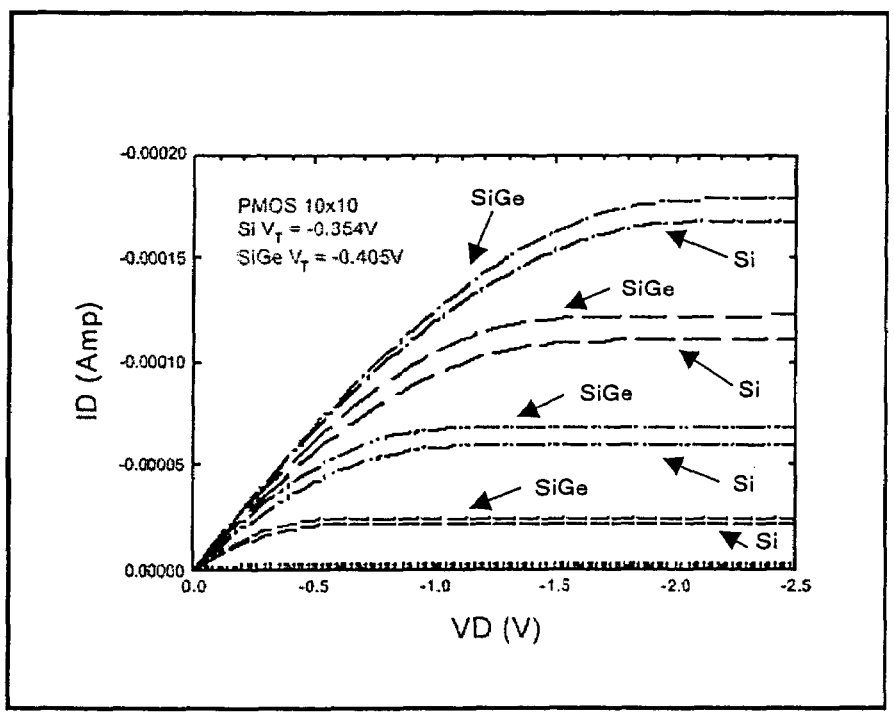
FIG. 27 is a graph showing Id-Vd characteristics exhibited by the PMOS transistor of FIG. 26 and a PMOS transistor formed on a conventional Si substrate.
Figure 28:
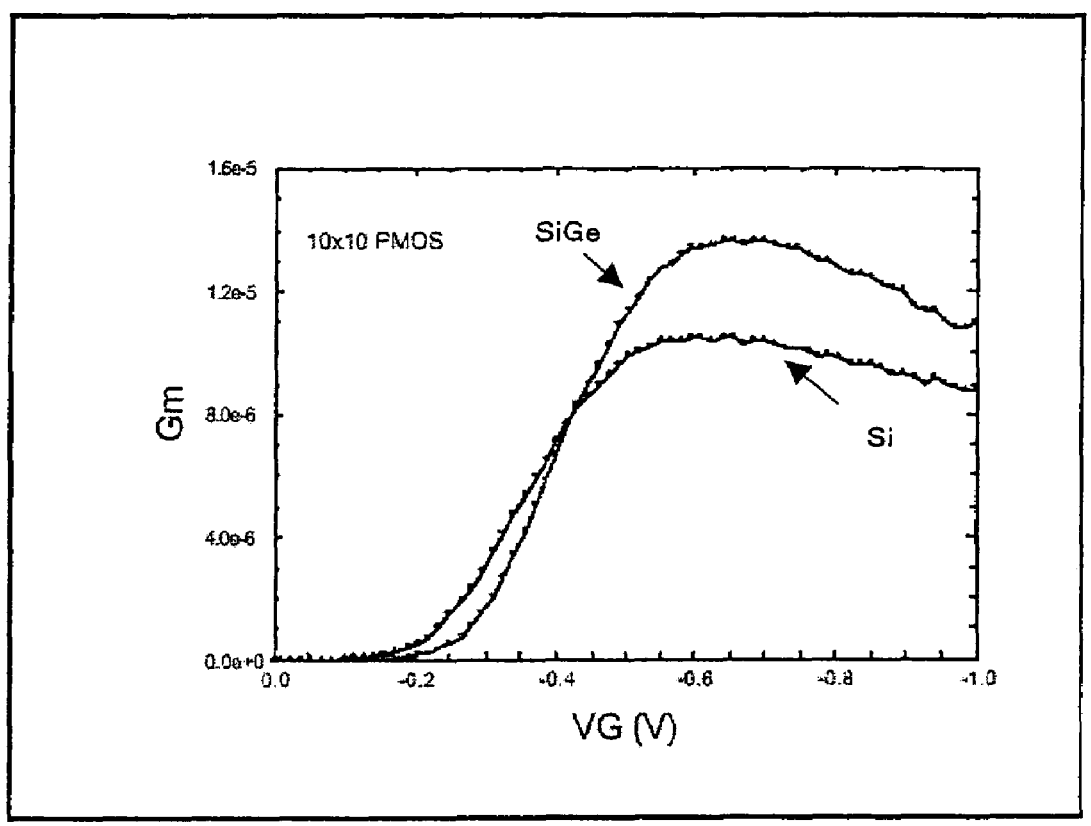
FIG. 28 is a graph showing Gm-Vg characteristics exhibited by the PMOS transistor of FIG. 26 and a PMOS transistor formed on a conventional Si substrate.

The distorted Si/SiGe/Si substrate had an upper layer Si thin film grown on the SiGe film, of which the distortion had been relaxed according to the "optimal conditions," and, therefore, a stretch distortion occured in the upper layer Si thin film. In addition, the distorted Si/SiGe interface was smooth and flat. Therefore, as shown in FIG. 27, the Id-Vd characteristics exhibited an increased drain current in comparison with that of a PMOS in a conventional Si substrate and, as shown in FIG. 28, the Gm-Vg characteristics exhibited a greater maximum value of Gm than that of a PMOS in a conventional Si substrate. Therefore, an increase in carrier mobility (here holes) was able to be confirmed.

As described above it was found according to the present invention that a predetermined range of appropriate conditions for quality improvement can be expressed using three parameters: elastic strain energy $U_{SiGe}$; the peak depth Rp; and amount of implanted ions and, therefore, the optimal hydrogen ion implantation condition, which depends on conditions such as the Ge concentration and the thickness of the SiGe film, can be determined using these parameters so that distortion relaxed SiGe film having an excellent surface condition, excellent crystallinity and a sufficient relaxation ratio can be formed.

Thus, a Si substrate wherein carrier mobility is greater than that of a conventional Si substrate can be provided by forming a Si thin film on a distortion relaxed SiGe film and it becomes possible to manufacture an excellent semiconductor device.

What is claimed is:

1. A method of improving a semiconductor substrate including a SiGe film on a Si or SOI substrate, the method including determining a relationship between a film condition of the SiGe film and a hydrogen ion implantation condition used in making the SiGe film so as to achieve relaxation of lattice distortion in the SiGe film as well as improved crystallinity and/or surface condition of the SiGe film, so that improved conditions for improving quality of the SiGe film on the Si or SOI substrate can be determined, the method comprising:

experimentally determining improvement conditions for making the semiconductor substrate so as to improve relaxation of lattice distortion in the SiGe film and to improve crystallinity and/or surface condition of the SiGe film, by using the following parameters (1), (2) and (3), (1) an elastic strain energy $U_{SiGe}$ which depends on a Ge concentration of the SiGe film and on a thickness of the SiGe film, (2) a peak depth Rp which is a distance between a SiGe/Si interface and a peak position of hydrogen ion concentration in the Si or SOI substrate and which depends on a hydrogen ion implantation energy and on the thickness of the SiGe film, and (3) an amount of hydrogen ions to be implanted;

determining an amount of hydrogen ions to be implanted and a hydrogen ion implantation energy for the SiGe film based on parameters (1), (2) and (3), and performing the hydrogen ion implantation in the SiGe film based on the determined ion implantation conditions; and wherein the hydrogen ion implantation comprises:

(a) calculating elastic strain energy $U_{SiGe}$ from both the Ge concentration and the thickness of the SiGe film;

(b) setting an optional amount of hydrogen ions to be implanted and hydrogen ion implantation energy, respectively;

(c) calculating the peak depth Rp from both the thickness of the SiGe film and the set hydrogen ion implantation energy; and (d) determining the amount of hydrogen ions as the parameter (3) and ion implantation energy of hydrogen ions to be implanted, respectively, if the calculated hydrogen ion implantation energy, the calculated the peak depth Rp and the set amount of hydrogen ions to be implanted are in a predetermined range as the experimentally determining improvement conditions by using the parameters (1), (2) and (3).

2. The method of claim 1, wherein the elastic strain energy $U_{SiGe}$ is not greater than a normalized value of 0.266.

3. The method of claim 1, wherein the amount of hydrogen ions to be implanted is in the range of $2\times10^{16}$ to $4\times10^{16}$ $H^+/cm^2$.

4. The method of claim 1, wherein the amount of hydrogen ions to be implanted and the hydrogen ion implantation energy for the SiGe film are determined using the elastic strain energy $U_{SiGe}$ parameter and the parameter of the peak depth parameter Rp when the previously set amount of hydrogen ions to be implanted is $2\times10^{16}$, $3\times10^{16}$, or $4\times10^{16}$ $H^+/cm^2$.

5. The method of claim 1, wherein a Si oxide film, a Si nitride film or a Si oxide nitride film is formed as a protection film on the SiGe film.

6. The method of claim 1, further comprising carrying out an annealing process in a nitrogen, argon, or hydrogen atmosphere.

7. The method of claim 1, wherein the semiconductor device comprises an upper layer semiconductor film including at least one layer, the upper layer semiconductor film being formed on the SiGe film of the semiconductor substrate.

8. The method of claim 7, wherein the semiconductor device further includes a top layer semiconductor film formed of a Si film.

9. The method of claim 8, wherein the semiconductor device further includes a MOS transistor having a gate oxide film and a gate electrode formed on the top layer semiconductor film and having a source and a drain formed at positions lower than the Si film.

10. A method of making a semiconductor substrate including a SiGe film on a Si or SOI substrate, hydrogen ion implantation be used in making the SiGe film, the method comprising:

determining an amount of hydrogen ions to be implanted and a hydrogen ion implantation energy for the SiGe film based on parameters (1), (2) and (3), so as to improve relaxation of lattice distortion in the SiGe film and to improve crystallinity and/or surface condition of the SiGe film:

(1) an elastic strain energy $U_{SiGe}$ which depends on a Ge concentration of the SiGe film and on a thickness of the SiGe film, (2) a peak depth Rp which is a distance between a SiGe/Si interface and a peak position of hydrogen ion concentration in the Si or SOI substrate and which depends on a hydrogen ion implantation energy and on the thickness of the SiGe film, and (3) an amount of hydrogen ions to be implanted;

performing the hydrogen ion implantation in the SiGe film based on the determined amount of hydrogen ions to be implanted and the determined ion implantation energy; and wherein the hydrogen ion implantation comprises:

(a) calculating elastic strain energy $U_{SiGe}$ from both the Ge concentration and the thickness of the SiGe film;

(b) setting an optional amount of hydrogen ions to be implanted and hydrogen ion implantation energy, respectively;

(c) calculating the peak depth Rp from both the thickness of the SiGe film and the set hydrogen ion implantation energy; and (d) determining the amount of hydrogen ions as parameter (3) and ion implantation energy of hydrogen ions to be implanted, respectively, if the calculated hydrogen ion implantation energy, the calculated the peak depth Rp and the set amount of hydrogen ions to be implanted are in a predetermined range as the experimentally determining improvement conditions by using the parameters (1), (2) and (3).

11. The method of claim 10, wherein the amount of hydrogen ions to be implanted is in the range of $2\times10^{16}$ to $4\times10^{16}$ $H^+/cm^2$.

12. The method of claim 10, wherein a Si oxide film, a Si nitride film or a Si oxide nitride film is formed as a protection film on the SiGe film.

13. The method of claim 10, further comprising carrying out an annealing process in a nitrogen, argon, or hydrogen atmosphere.

14. The method of claim 10, wherein the semiconductor device comprises an upper layer semiconductor film including at least one layer, the upper layer semiconductor film being formed on the SiGe film of the semiconductor substrate.

15. The method of claim 14, wherein the semiconductor device further includes a top layer semiconductor film formed of a Si film.

16. The method of claim 15, wherein the semiconductor device further includes a MOS transistor having a gate oxide film and a gate electrode formed on the top layer semiconductor film and having a source and a drain formed at positions lower than the Si film.

17. The method of claim 10, wherein the elastic strain energy $U_{SiGe}$ is not greater than a normalized value of 0.266.

18. The method of claim 10, wherein the range of the improvement conditions is determined by the parameter of the elastic strain energy $U_{SiGe}$ and the parameter of the peak depth parameter Rp when the previously set amount of hydrogen ions to be implanted is $2\times10^{16}$, $3\times10^{16}$, or $4\times10^{16}$ $H^+/cm^2$.

* * * * *